US012812984B2

(12) United States Patent
Hamano et al.

(10) Patent No.: US 12,812,984 B2
(45) Date of Patent: Nov. 24, 2026

(54) PHOTOELECTRIC CONVERSION MODULE AND MANUFACTURING METHOD FOR PHOTOELECTRIC CONVERSION MODULE

(71) Applicant: IDEMITSU KOSAN CO., LTD., Tokyo (JP)

(72) Inventors: Mikio Hamano, Tokyo (JP); Hitoshi Tomita, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 19/119,678

(22) PCT Filed: Oct. 10, 2023

(86) PCT No.: PCT/JP2023/036658
§ 371 (c)(1),
(2) Date: Apr. 9, 2025

(87) PCT Pub. No.: WO2024/080261
PCT Pub. Date: Apr. 18, 2024

(65) Prior Publication Data
US 2026/0136681 A1 May 14, 2026

(30) Foreign Application Priority Data
Oct. 11, 2022 (JP) ................................ 2022-163018

(51) Int. Cl.
*H10F 19/90* (2025.01)
*H10F 71/00* (2025.01)

(52) U.S. Cl.
CPC ......... *H10F 19/902* (2025.01); *H10F 71/137* (2025.01)

(58) Field of Classification Search
CPC ...... H10F 19/902; H10F 71/137; H10F 19/40; H10F 19/90
See application file for complete search history.

(56) References Cited

U.S. PATENT DOCUMENTS

2013/0192660 A1* 8/2013 Siskavich ............... H02S 40/42 136/246
2017/0125619 A1 5/2017 Nakano et al.
(Continued)

FOREIGN PATENT DOCUMENTS

CN 112117338 A 12/2020
EP 3 905 341 A1 11/2021
(Continued)

OTHER PUBLICATIONS

International Searching Authority, "International Search Report," issued in connection with International Patent Application No. PCT/JP2023/036658, dated Dec. 5, 2023.
(Continued)

*Primary Examiner* — Angelo Trivisonno
(74) *Attorney, Agent, or Firm* — Foley & Lardner LLP

(57) ABSTRACT

Provided is a photoelectric conversion module that is capable of suppressing a short circuit and that has a welding part. A photoelectric conversion module (100) comprises: a photoelectric conversion element (10*a*); a first welding part (210*a*) provided on a first surface of the photoelectric conversion element (10*a*); and a second welding part (220*b*) provided on a second surface of the photoelectric conversion element (10*a*), the second surface being opposite to the first surface. A center of gravity of the first welding part (210*a*) is shifted from a center of gravity of the second welding part (220*b*) when viewed from a thickness direction perpendicular to the first surface of the photoelectric conversion element (10*a*).

13 Claims, 15 Drawing Sheets

(56) References Cited

U.S. PATENT DOCUMENTS

| | | | | |
|---|---|---|---|---|
| 2017/0323995 | A1* | 11/2017 | Gislon .................... | H10F 19/00 |
| 2021/0408314 | A1 | 12/2021 | Wang et al. | |

FOREIGN PATENT DOCUMENTS

| | | | |
|---|---|---|---|
| JP | H05-116692 | A | 5/1993 |
| JP | H06-140651 | A | 5/1994 |
| JP | 2009-010355 | A | 1/2009 |
| JP | 2011-077148 | A | 4/2011 |
| JP | 2011-114072 | A | 6/2011 |
| JP | 2016-119401 | A | 6/2016 |
| JP | 2021-528835 | A | 10/2021 |
| WO | WO-2015/152020 | A1 | 10/2015 |

OTHER PUBLICATIONS

International Searching Authority, "Written Opinion," issued in connection with International Patent Application No. PCT/JP2023/036658, dated Dec. 5, 2023.

* cited by examiner

PHOTOELECTRIC CONVERSION MODULE AND MANUFACTURING METHOD FOR PHOTOELECTRIC CONVERSION MODULE

CROSS-REFERENCE TO RELATED APPLICATIONS

The present application claims priority under 35 U.S.C. § 371 to International Patent Application No. PCT/JP2023/036658, filed Oct. 10, 2023, which claims priority to and the benefit of Japanese Patent Application No. 2022-163018, filed on Oct. 11, 2022. The contents of these applications are hereby incorporated by reference in their entireties.

TECHNICAL FIELD

The present invention relates to a photoelectric conversion module and a method for manufacturing the photoelectric conversion module.

BACKGROUND ART

A photoelectric conversion module that converts light energy into electric energy is known (Patent Literature 1). The photoelectric conversion module disclosed in Patent Literature 1 includes a plurality of photoelectric conversion elements. End parts of the photoelectric conversion elements adjacent to each other overlap each other. The photoelectric conversion elements adjacent to each other are electrically connected to each other by a conductor such as solder in a region in which the photoelectric conversion elements overlap each other (see FIGS. 5 and 6 of Patent Literature 1).

CITATION LIST

Patent Literature

Patent Literature 1: JP 2016-119401 A

SUMMARY

For example, in a photoelectric conversion module for used in space, in the air, or in a mobile object such as a vehicle, a large load may be applied to a connection part between the photoelectric conversion elements depending on a load such as vibration applied to the mobile object. In some cases, it is not possible to ensure sufficient reliability for such a load in electrical connection by a conductor such as solder.

The inventor of the present application has examined connection of a conductor such as a conductive interconnector to a photoelectric conversion element by welding. In this case, the inventor of the present application has found a problem that the electrodes of the photoelectric conversion elements may be short-circuited to each other due to the influence of high heat during welding.

Therefore, it is desirable to provide a photoelectric conversion module capable of suppressing an occurrence of a short circuit and having a welding part, and a method for manufacturing the photoelectric conversion module.

A photoelectric conversion module in one aspect comprises: a photoelectric conversion element; a first welding part provided on a first surface of the photoelectric conversion element; and a second welding part provided on a second surface of the photoelectric conversion element, the second surface being opposite to the first surface. A center of gravity of the first welding part is shifted from a center of gravity of the second welding part when viewed from a thickness direction perpendicular to the first surface of the photoelectric conversion element.

A method for manufacturing a photoelectric conversion module in one aspect comprises: a step of preparing a photoelectric conversion element; and a welding step of forming a first welding part on a first surface of the photoelectric conversion element and forming a second welding part on a second surface of the photoelectric conversion element, the second surface being opposite to the first surface. In the welding step, the first welding part is formed such that a center of gravity of the first welding part is shifted from a center of gravity of the second welding part when viewed from a thickness direction perpendicular to the first surface of the photoelectric conversion element.

DESCRIPTION OF EMBODIMENTS

Figure 1:
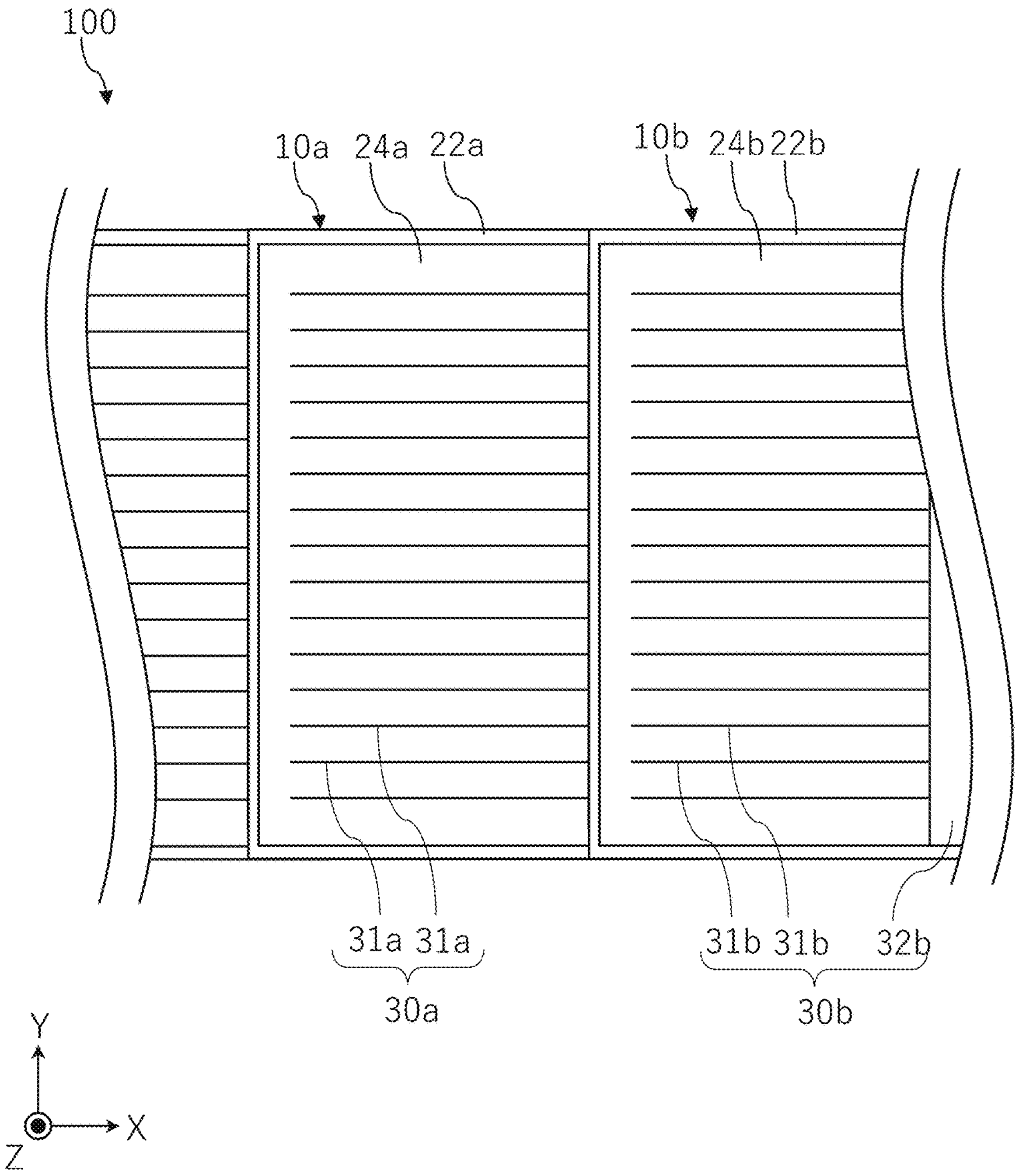
FIG. 1 is a schematic plan view of a photoelectric conversion module according to a first embodiment.

Hereinafter, embodiments will be described with reference to the drawings. In the following drawings, the same or similar parts are denoted by the same or similar reference numerals. However, it should be noted that the drawings are schematic, and ratios of dimensions and the like may be different from actual ones.

It should be noted that, in the present specification, the terms “first” and “second” do not represent quantities of objects to which the terms are attached, but are used for convenience to distinguish the objects to which the terms are attached.

First Embodiment

Figure 2:
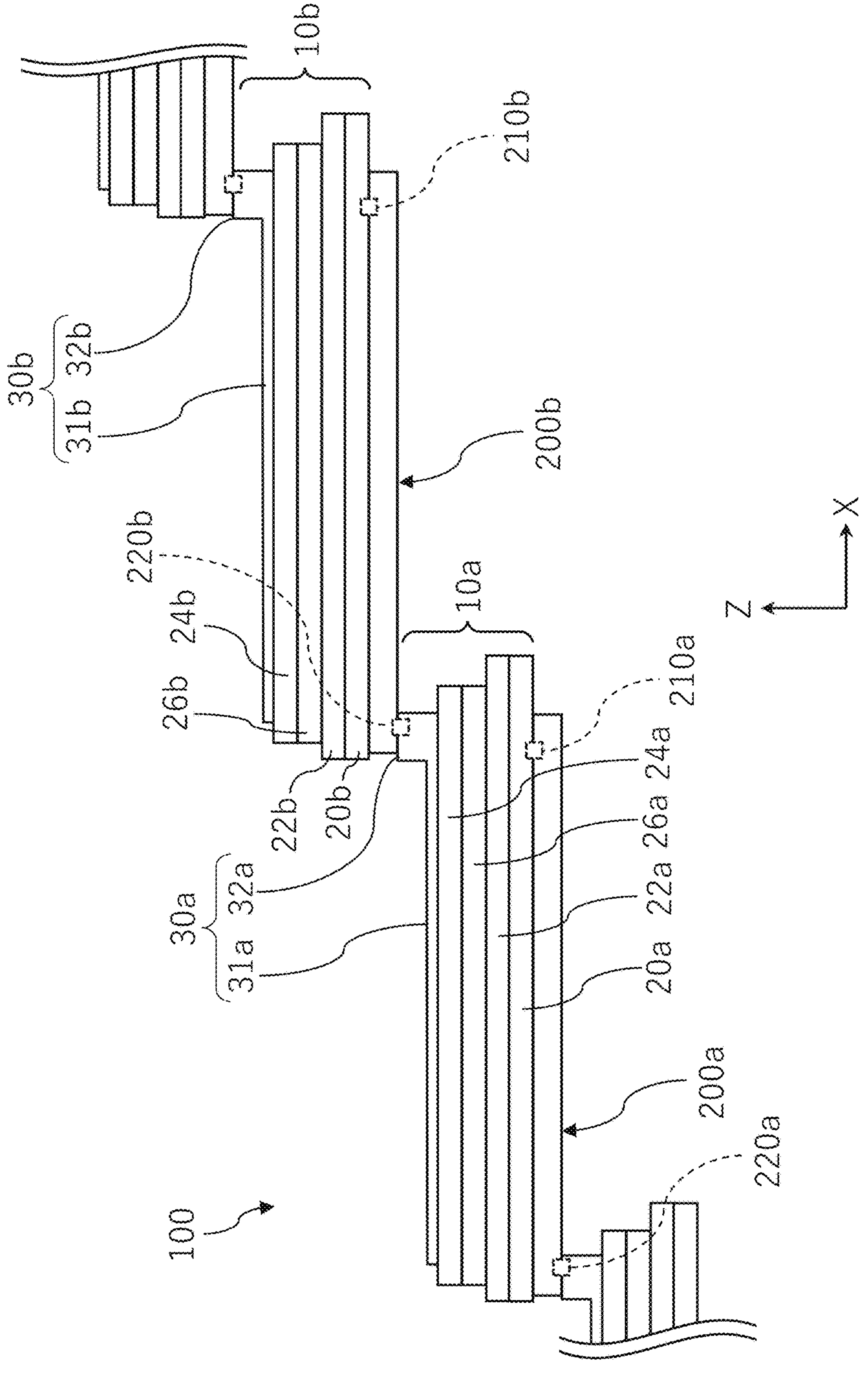
FIG. 2 is a schematic side view of the photoelectric conversion module according to the first embodiment when viewed from a Y direction in FIG. 1.
Figure 3:
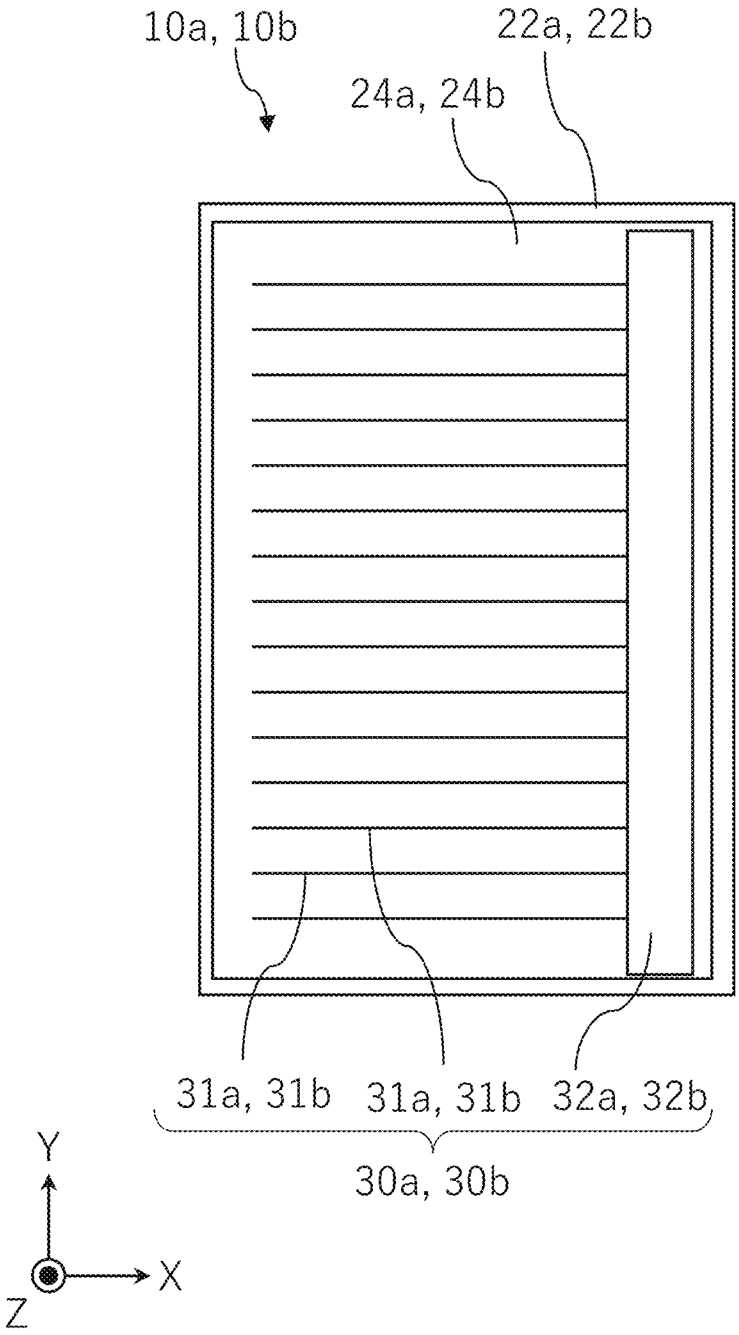
FIG. 3 is a schematic plan view of each photoelectric conversion element constituting the photoelectric conversion module.
Figure 4:
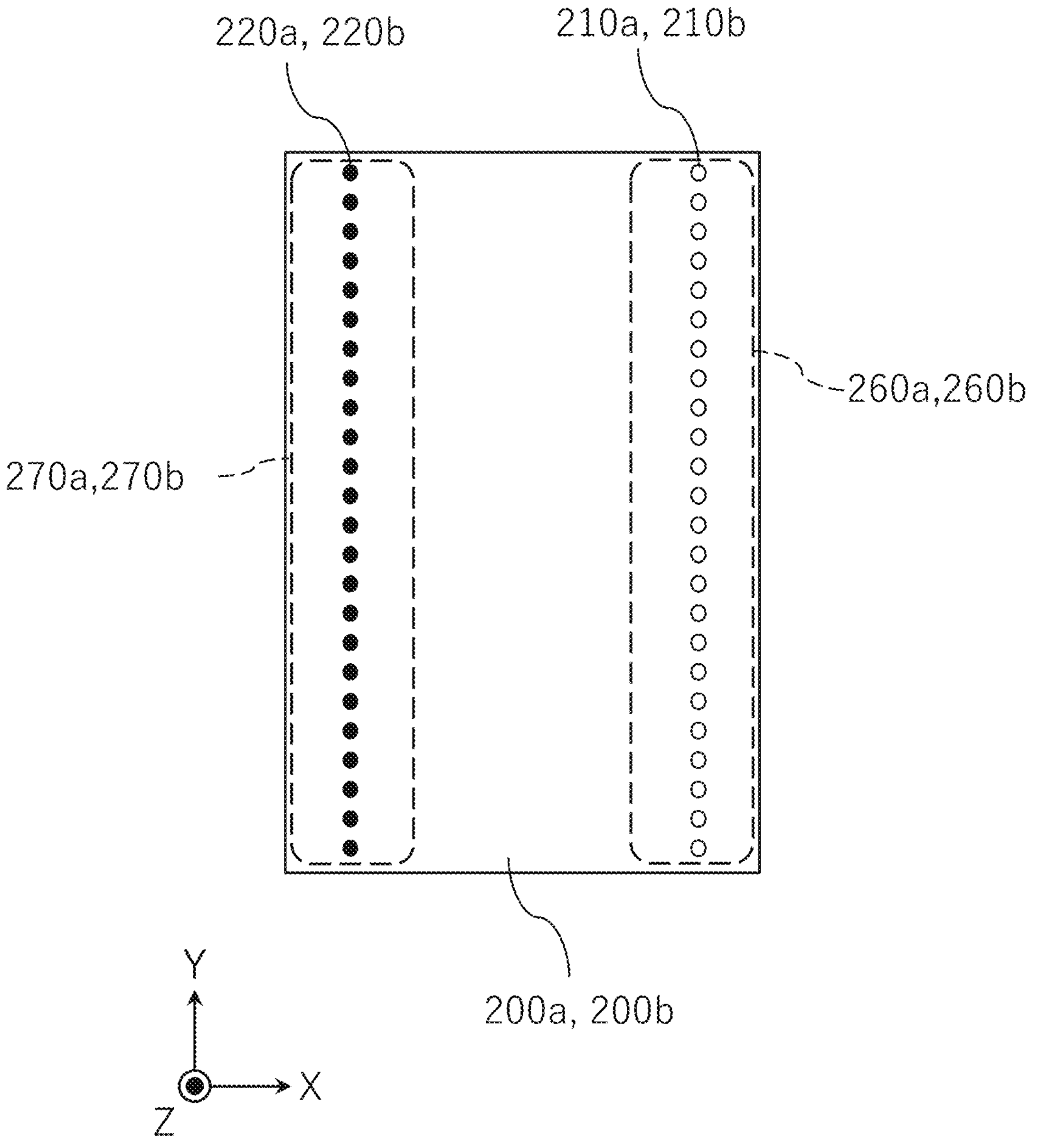
FIG. 4 is a schematic plan view of each interconnector.

FIG. 1 is a schematic plan view of a photoelectric conversion module according to a first embodiment. FIG. 2 is a schematic side view of the photoelectric conversion module according to the first embodiment when viewed from a Y direction in FIG. 1. FIG. 3 is a schematic plan view of each photoelectric conversion element constituting the photoelectric conversion module. In FIG. 3, in order to describe the structure of each photoelectric conversion element constituting the photoelectric conversion module, it should be noted that reference signs related to each photoelectric conversion element are given. FIG. 4 is a schematic plan view of each interconnector. It should be noted that in FIG. 4, reference signs related to each interconnector constituting the photoelectric conversion module are given.

A photoelectric conversion module 100 according to the first embodiment includes a plurality of photoelectric conversion elements 10*a* and 10*b*, and interconnectors 200*a* and 200*b* that electrically connect the photoelectric conversion elements 10*a* and 10*b* adjacent to each other. The plurality of photoelectric conversion elements 10*a* and 10*b* are arranged side by side in a second direction (X direction in the drawing. The same applies hereinafter). The photoelectric conversion elements 10*a* and 10*b* adjacent to each other are provided side by side to partially overlap each other. Specifically, one end parts of the photoelectric conversion elements 10*a* and 10*b* overlap the other end parts of the photoelectric conversion elements 10*a* and 10*b* adjacent thereto, in a thickness direction. The photoelectric conversion elements 10*a* and 10*b* adjacent to each other are electrically connected to each other by the interconnectors 200*a* and 200*b* in the overlapping portions. The number of photoelectric conversion elements 10*a* and 10*b* arranged in the second direction only needs to be at least 2, and preferably is 3 or more.

The photoelectric conversion elements 10*a* and 10*b* may be, for example, a compound-based photoelectric conversion element such as a CZTS-based photoelectric conversion element, a CIGS-based photoelectric conversion element, a CdTe-based photoelectric conversion element, or a GaAs-based photoelectric conversion element, or a known photoelectric conversion element such as a silicon-based photoelectric conversion element or an organic-based photoelectric conversion element. Preferably, the photoelectric conversion elements 10*a* and 10*b* are solar cell elements that convert light energy into electrical energy.

Although not essential, each of the photoelectric conversion elements 10*a* and 10*b* may include conductive substrates 20*a* and 20*b* as bases for forming each layer such as first electrode layers 22*a* and 22*b* which will be described later. The conductive substrates 20*a* and 20*b* may be constituted by a substrate such as a metal substrate. Further, the conductive substrates 20*a* and 20*b* may be flexible substrates. The shapes and dimensions of the conductive substrates 20*a* and 20*b* are appropriately determined in accordance with the sizes and the like of the photoelectric conversion elements 10*a* and 10*b*.

When a metal substrate is adopted as the conductive substrates 20*a* and 20*b*, the conductive substrates 20*a* and 20*b* are formed of, for example, titanium (Ti), stainless steel (SUS), copper, aluminum, an alloy thereof, or the like. Alternatively, the conductive substrates 20*a* and 20*b* may have a laminated structure in which a plurality of metal base materials are laminated, and for example, a stainless foil, a titanium foil, and a molybdenum foil may be formed on the surface of the substrate. In order to prevent warpage, a film of a metal material such as molybdenum, titanium, or chromium may be formed on the back side of the conductive substrates 20*a* and 20*b*.

When the conductive substrates 20*a* and 20*b* are flexible metal substrates, the photoelectric conversion elements 10*a* and 10*b* can be bent, and cracking of the conductive substrates 20*a* and 20*b* due to bending can also be suppressed. Furthermore, in the above case, it is easy to reduce the weight and thickness of the photoelectric conversion module 100 as compared with a glass substrate.

The photoelectric conversion elements 10*a* and 10*b* may include at least first electrode layers 22*a* and 22*b*, second electrode layers 24*a* and 24*b*, and photoelectric conversion layers 26*a* and 26*b* provided between the first electrode layers 22*a* and 22*b* and the second electrode layers 24*a* and 24*b*. The second electrode layers 24*a* and 24*b* have a polarity different from the polarity of the first electrode layers 22*a* and 22*b*. The photoelectric conversion layers 26*a* and 26*b* are layers that contribute to mutual conversion of light energy and electric energy. In a solar cell element that converts light energy into electric energy, the photoelectric conversion layers 26*a* and 26*b* may be referred to as light absorption layers.

The first electrode layers 22*a* and 22*b* and the second electrode layers 24*a* and 24*b* are adjacent to the photoelectric conversion layers 26*a* and 26*b*. In the present specification, it is assumed that the term "adjacent" means not only that both layers are in direct contact, but also that both layers are in close contact via another layer.

The first electrode layers 22*a* and 22*b* are provided between the photoelectric conversion layers 26*a* and 26*b* and the conductive substrates 20*a* and 20*b*. The second electrode layers 24*a* and 24*b* are located on the side opposite to the conductive substrates 20*a* and 20*b* with respect to the photoelectric conversion layers 26*a* and 26*b*. Thus, the photoelectric conversion layers 26*a* and 26*b* are located between the first electrode layers 22*a* and 22*b* and the second electrode layers 24*a* and 24*b*. The first electrode layers 22*a* and 22*b* are connected to the conductive substrates 20*a* and 20*b*.

In the present embodiment, the second electrode layers 24*a* and 24*b* may be constituted by transparent electrode layers. When the second electrode layers 24*a* and 24*b* are constituted by the transparent electrode layers, light that enters into the photoelectric conversion layers 26*a* and 26*b* or is emitted from the photoelectric conversion layers 26*a* and 26*b* passes through the second electrode layers 24*a* and 24*b*.

When the second electrode layers 24*a* and 24*b* are constituted by the transparent electrode layers, the first electrode layers 22*a* and 22*b* may be constituted by opaque electrode layers or may be constituted by transparent electrode layers. The first electrode layers 22*a* and 22*b* may be formed of, for example, a metal such as molybdenum, titanium, or chromium.

As an example, the second electrode layers 24*a* and 24*b* may be formed of an n-type semiconductor, more specifically, a material having n-type conductivity and relatively low resistance. The second electrode layers 24*a* and 24*b* may also function as an n-type semiconductor and a transparent electrode layer. The second electrode layers 24*a* and 24*b* include, for example, a metal oxide to which a Group III element (B, Al, Ga, or In) is added as a dopant. Examples of the metal oxide include Zno and $SnO_2$. The second electrode layer 24 can be selected from, for example, indium tin oxide ($In_2O_3$:Sn), indium titanium oxide ($In_2O_3$:Ti), indium zinc oxide ($In_2O_3$:Zn), tin zinc-doped indium oxide ($In_2O_3$:Sn, Zn), tungsten-doped indium oxide ($In_2O_3$:W), hydrogen-doped indium oxide ($In_2O_3$:H), indium gallium zinc oxide ($InGaZnO_4$), zinc tin oxide (ZnO:Sn), fluorine-doped tin oxide ($SnO_2$:F), gallium-doped zinc oxide (ZnO:Ga), boron-doped zinc oxide (Zno:B), aluminum-doped zinc oxide (ZnO:Al), and the like.

The photoelectric conversion layers 26*a* and 26*b* have a configuration corresponding to the type of photoelectric conversion element. For example, in the case of a silicon-based photoelectric conversion element, the photoelectric conversion layers 26*a* and 26*b* may contain an n-type semiconductor (n-type silicon) and a p-type semiconductor (p-type silicon). In addition, the photoelectric conversion layers 26*a* and 26*b* may contain i-type silicon between the n-type semiconductor and the p-type semiconductor. The photoelectric conversion layers 26*a* and 26*b* may further include a buffer layer (not illustrated).

In the case of a compound-based photoelectric conversion element such as a CZTS-based photoelectric conversion element, a CIGS-based photoelectric conversion element, a CdTe-based photoelectric conversion element, or a GaAs-based photoelectric conversion element, the photoelectric conversion layers 26*a* and 26*b* may contain, for example, a p-type semiconductor. In a specific example, the photoelectric conversion layers 26*a* and 26*b* may function as, for example, a polycrystalline or microcrystalline p-type compound semiconductor layer.

In a specific example of the CIGS-based photoelectric conversion element, the photoelectric conversion layers 26*a* and 26*b* are formed of a chalcogen semiconductor containing a chalcogen element, and function as a polycrystalline or microcrystalline p-type compound semiconductor layer. The photoelectric conversion layers 26*a* and 26*b* are formed of, for example, a Group I-III-$VI_2$ compound semiconductor having a chalcopyrite structure containing a Group I element, a Group III element, and a Group VI element (chalcogen element). Here, the Group I element can be selected from copper (Cu), silver (Ag), gold (Au), and the like. The Group III element can be selected from indium (In), gallium (Ga), aluminum (Al), and the like. In addition, the photoelectric conversion layers 26*a* and 26*b* may contain tellurium (Te) or the like in addition to selenium (Se) and sulfur(S) as the Group VI element. In addition, the photoelectric conversion layers 26*a* and 26*b* may contain alkali metals such as Li, Na, K, Rb, and Cs.

Alternatively, the photoelectric conversion layers 26*a* and 26*b* may be formed of a Group $I_2$-(II-IV)-$VI_4$ compound semiconductor which is a CZTS-based chalcogen semiconductor containing Cu, Zn, Sn, S, or Se. Representative examples of the CZTS-based chalcogen semiconductor include materials using a compound such as $Cu_2ZnSnSe_4$ or $Cu_2ZnSn$ (S, Se)$_4$.

The photoelectric conversion layers 26*a* and 26*b* are not limited to those described above, and may be formed of any material that causes photoelectric conversion.

The photoelectric conversion elements 10*a* and 10*b* may include a first buffer layer (not illustrated) between the photoelectric conversion layers 26*a* and 26*b* and the first electrode layers 22*a* and 22*b* as necessary. The first buffer layer may be a semiconductor material having the same conductivity type as the first electrode layers 22*a* and 22*b*, or may be a semiconductor material having a different conductivity type. The first buffer layer may be formed of a material having higher electric resistance than the first electrode layers 22*a* and 22*b*.

The first buffer layer is not particularly limited, and may be, for example, a layer containing a chalcogenide compound of a transition metal element having a layered structure. Specifically, the first buffer layer may be formed of a compound including a transition metal material such as Mo, W, Ti, V, Cr, Nb, or Ta and a chalcogen element such as O, S, or Se. The first buffer layer may be, for example, a Mo(Se, S)$_2$ layer, a $MoSe_2$ layer, a $MoS_2$ layer, or the like.

The photoelectric conversion elements 10*a* and 10*b* may include a second buffer layer (not illustrated) between the photoelectric conversion layers 26*a* and 26*b* and the second electrode layers 24*a* and 24*b* if necessary. In this case, the second buffer layer may be a semiconductor material having the same conductivity type as the second electrode layers 24*a* and 24*b*, or may be a semiconductor material having a different conductivity type. The second buffer layer may be formed of a material having higher electric resistance than the second electrode layers 24*a* and 24*b*. The second buffer layer is formed on the photoelectric conversion layers 26*a* and 26*b*.

The second buffer layer can be selected from compounds containing zinc (Zn), cadmium (Cd), and indium (In). Examples of the compound containing zinc include Zno, ZnS, $Zn(OH)_2$, or Zn(O, S) and Zn(O, S, OH) which are mixed crystals thereof, and further include ZnMgO and ZnSnO. Examples of the compound containing cadmium include CdS, CdO, or Cd(O, S) and Cd(O, S, OH) which are mixed crystals thereof. Examples of the compound containing indium include $In_2S_3$ and $In_2O_3$, and $In_2$(O, S)$_3$ and $In_2$(O, S, OH)$_3$ which are mixed crystals thereof, and $In_2O_3$, $In_2S_3$, $In(OH)_x$, and the like can be used. In addition, the second buffer layer may have a laminated structure of these compounds.

The second buffer layer has an effect of improving characteristics such as photoelectric conversion efficiency, but can be omitted. When the second buffer layer is omitted, the second electrode layers 24*a* and 24*b* are formed directly on the photoelectric conversion layers 26*a* and 26*b*.

It should be noted that the laminated structure of the photoelectric conversion elements 10*a* and 10*b* is not limited to the above aspect, and may take various aspects. For example, the photoelectric conversion elements 10*a* and 10*b* may have a configuration in which both an n-type semiconductor and a p-type semiconductor are sandwiched between the first electrode layer and the second electrode layer. In this case, the second electrode layer does not need to be formed of an n-type semiconductor. In addition, the photoelectric conversion elements 10*a* and 10*b* are not limited to a p-n coupling type structure, and may have a p-i-n coupling type structure including an intrinsic semiconductor layer (i-type semiconductor) between an n-type semiconductor and a p-type semiconductor.

The thickness from the lower surfaces of the first electrode layers 22*a* and 22*b* to the upper surfaces of the second electrode layers 24*a* and 24*b* is not particularly limited, and may be, for example, about 1.5 μm to 10 μm.

The photoelectric conversion elements 10*a* and 10*b* include current-collecting electrodes 30*a* and 30*b* connected to the second electrode layers 24*a* and 24*b*, respectively. The current-collecting electrodes 30*a* and 30*b* collect charge carriers from the second electrode layers 24*a* and 24*b*, and are formed of a conductive material. The current-collecting electrodes 30*a* and 30*b* may be in direct contact with the second electrode layers 24*a* and 24*b*. It is preferable that the areas of the current-collecting electrodes 30*a* and 30*b* be as small as possible from the viewpoint of ensuring a photoelectric convertible region that contributes to photoelectric conversion.

The current-collecting electrodes 30*a* and 30*b* may have a plurality of substantially linear first portions 31*a* and 31*b* and second portions 32*a*, 32*b* connected to the plurality of first portions 31*a* and 31*b*. The first portions 31*a* and 31*b* may be referred to as "fingers". The second portions 32*a* and 32*b* may be referred to as "bus bars".

The first portions 31*a* and 31*b* are provided side by side at intervals. The first portions 31*a* and 31*b* have a function of guiding electric energy (charge carriers) generated in the photoelectric conversion layers 26*a* and 26*b* to the second portions 32*a* and 32*b*.

In the illustrated aspect, the substantially linear first portions 31*a* and 31*b* extend straight along the second direction (X direction in the drawing). Alternatively, the first portions 31*a* and 31*b* may extend in a wavy line shape or a zigzag polygonal line shape. In the present specification, the term "linear" is defined by a concept including not only a straight line but also an elongated curved line such as a wavy line or a polygonal line.

A plurality of the first portions 31*a* and 31*b* of the current-collecting electrodes 30*a* and 30*b* may be provided side by side in a first direction (Y direction in the drawing. The same applies hereinafter). Here, the first direction is defined by a direction intersecting the above second direction. The plurality of linear first portions 31*a* and 31*b* may be joined to the single second portions 32*a* and 32*b*. The plurality of first portions 31*a* and 31*b* may be provided on one side with respect to the second portions 32*a* and 32*b*.

The second portions 32*a* and 32*b* of the current-collecting electrodes 30*a* and 30*b* may extend along the first direction. The second portions 32*a* and 32*b* may be connected to the first portions 31*a* and 31*b* at the end parts of the first portions 31*a* and 31*b*. In this case, the plurality of first portions 31*a* and 31*b* may extend from the second portions 32*a* and 32*b* along the second direction.

The second portions 32*a* and 32*b* of the current-collecting electrodes 30*a* and 30*b* may extend substantially from the vicinity of one ends to the vicinity of the other ends of the photoelectric conversion elements 10*a* and 10*b* in the first direction. The widths of the second portions 32*a* and 32*b* of the current-collecting electrodes 30*a* and 30*b* in the second direction may be larger than the widths of the first portions 31*a* and 31*b* in the first direction.

The current-collecting electrodes 30*a* and 30*b* (first portions 31*a* and 31*b* and second portions 32*a* and 32*b*) may be formed of a material having higher conductivity than the material forming the second electrode layers 24*a* and 24*b*. As a material forming the current-collecting electrodes 30*a* and 30*b* (first portions 31*a* and 31*b* and second portions 32*a* and 32*b*), a material having favorable conductivity and capable of obtaining high adhesion to the second electrode layers 24*a* and 24*b* is applied. For example, the material forming the current-collecting electrodes 30*a* and 30*b* can be selected from at least one of indium tin oxide ($In_2O_3$:Sn), indium titanium oxide ($In_2O_3$:Ti), indium zinc oxide ($In_2O_3$:Zn), tin-zinc-doped indium oxide ($In_2O_3$:Sn, Zn), tungsten-doped indium oxide ($In_2O_3$:W), hydrogen-doped indium oxide ($In_2O_3$:H), indium gallium zinc oxide ($InGaZnO_4$), zinc tin oxide (ZnO:Sn), fluorine-doped tin oxide ($SnO_2$:F), aluminum-doped zinc oxide (ZnO:Al), boron-doped zinc oxide (ZnO:B), gallium-doped zinc oxide (ZnO:Ga), Ni, Ti, Cr, Mo, Al, Ag, and Cu, or a compound containing one or more of these materials. The current-collecting electrodes 30*a* and 30*b* may be formed of an alloy or a laminate formed of a combination of the above-described materials.

The second portions 32*a* and 32*b* of the current-collecting electrodes 30*a* and 30*b* are provided near one end parts of the photoelectric conversion elements 10*a* and 10*b* in plan view when viewed from a direction perpendicular to the surface of the photoelectric conversion element (see FIG. 3). In the present embodiment, the second portions 32*a* and 32*b* of the current-collecting electrodes 30*a* and 30*b* extend along the first direction along the end parts in the vicinity of the end parts of the photoelectric conversion elements 10*a* and 10*b* in the second direction.

Here, the first photoelectric conversion element 10*a* may include a photoelectric convertible region that contributes to photoelectric conversion and a non-photoelectric conversion region that does not contribute to photoelectric conversion. The photoelectric convertible region may be, for example, a region in which the first electrode layer 22*a*, the photoelectric conversion layer 26*a*, and the second electrode layer 24*a* are laminated on each other, and a region that is not covered with an opaque structure when viewed from the thickness direction (Z direction in the drawing).

The non-photoelectric conversion region may be defined by, for example, a region in which the first electrode layer 22*a*, the photoelectric conversion layer 26*a*, and the second electrode layer 24*a* are not laminated with each other, or a region covered with an opaque structure when viewed from the thickness direction (Z direction in the drawing). For example, when viewed from the thickness direction, a region of the first photoelectric conversion element 10*a* covered with the second photoelectric conversion element 20*a* corresponds to the non-photoelectric conversion region. In addition, when viewed from the thickness direction, a region covered with the second portion 32*a* of the current-collecting electrode 30*a* corresponds to the non-photoelectric conversion region.

The conductive substrate 20*b* of the second photoelectric conversion element 10*b* may be disposed to overlap a part of the current-collecting electrode 30*a* of the first photoelectric conversion element 10*a* (see FIGS. 1 and 2). Specifically, the conductive substrate 20 *b* of the second photoelectric conversion element 10*b* may cover at least a part of the second portion 32*a* of the current-collecting electrode 30*a* of the first photoelectric conversion element 10*a* when viewed from the thickness direction.

Preferably, the second photoelectric conversion element 10*b* does not cover the first portion 31*a* of the current-collecting electrode 30*a* of the first photoelectric conversion element 10*a*. As a result, the region of the first photoelectric conversion element 10*a* exposed from the second photoelectric conversion element 10*b* increases, so that it is possible to ensure a wide photoelectric convertible region of the first photoelectric conversion element 10*a*. Thus, it is possible to improve the photoelectric conversion efficiency of the entire photoelectric conversion module 100.

The second photoelectric conversion element 10*b* covers at least a part, preferably the entirety of the second portion 32*a* of the current-collecting electrode 30*a* of the first photoelectric conversion element 10*a*. More preferably, the second photoelectric conversion element 10*b* is disposed to substantially not cover the first portion 31*a* while substantially entirely covering the second portion 32*a* of the current-collecting electrode 30*a* of the first photoelectric conversion element 10*a*. As a result, it is possible to densely dispose the first photoelectric conversion element 10*a* and the second photoelectric conversion element 10*b* such that the region that does not contribute to photoelectric conversion, that is, the region of the second portion 32*a* is not exposed. Thus, it is possible to reduce the size of the photoelectric conversion module as a whole without reducing the efficiency of photoelectric conversion.

The interconnectors 200*a* and 200*b* mechanically and electrically connect the photoelectric conversion elements 10*a* and 10*b* adjacent to each other. The interconnectors 200*a* and 200*b* are connected to the photoelectric conversion elements 10*a* and 10*b* by welding.

The interconnectors 200*a* and 200*b* may include a conductive member. Specifically, the interconnector 200 may be, for example, a ribbon wire of a conductive metal including Ag, Ni, Co, Fe, Cr, Mo, Mn, Cu, Al, Ti, or a combination thereof. Furthermore, the interconnector 200 may be formed of an alloy containing some of the above-described conductive metals, for example, an alloy Kovar or stainless steel (SUS).

In the first embodiment, each of the interconnectors 200*a* and 200*b* may be a conductive sheet having a substantially rectangular or substantially square shape. Alternatively, each of the interconnectors 200*a* and 200*b* may be a mesh-like member having a substantially rectangular or substantially square shape.

Each of the interconnectors 200*a* and 200*b* may have first weldable parts 260*a* and 260*b* capable of forming the first welding parts 210*a* and 210*b*, and second weldable parts 270*a* and 270*b* capable of forming the second welding parts 220*a* and 220*b* separated from the first welding parts 210*a* and 210*b* in the second direction. Here, the first weldable parts 260*a* and 260*b* and the second weldable parts 270*a* and 270*b* may be regions separated from each other. Alternatively, the first weldable parts 260*a* and 260*b* and the second weldable parts 270*a* and 270*b* may correspond to respective portions of an integral region that is not separated from each other. That is, as long as the first welding parts 210*a* and 210*b* and the second welding parts 220*a* and 220*b* can be formed at positions separated from each other in the second direction, boundaries between the first weldable parts 260*a* and 260*b* and the second weldable parts 270*a* and 270*b* do not need to be clearly defined.

The first welding parts 210*a* and 210*b* and the second welding parts 220*a* and 220*b* mean portions in which the interconnectors 200*a* and 200*b* and the photoelectric conversion elements 10*a* and 10*b* are welded to each other. Thus, the first welding parts 210*a* and 210*b* and the second welding parts 220*a* and 220*b* are formed over both the interconnectors 200*a* and 200*b* and the photoelectric conversion elements 10*a* and 10*b*. Therefore, in the following description, it should be noted that the first welding parts 210*a* and 210*b* and the second welding parts 220*a* and 220*b* may be described as components provided in the interconnectors 200*a* and 200*b*, or may be described as components provided in the photoelectric conversion elements 10*a* and 10*b*.

Preferably, the first weldable parts 260*a* and 260*b* may be regions in which the plurality of first welding parts 210*a* and 210*b* provided side by side in the first direction can be formed. Similarly, the second weldable parts 270*a* and 270*b* may be regions in which the plurality of second welding parts 220*a* and 220*b* provided side by side in the first direction can be formed (see FIG. 4).

Preferably, the first welding parts 210*a* and 210*b* can be formed at the end parts of the interconnectors 200*a* and 200*b* in the second direction. In this case, preferably, the second welding parts 220*a* and 220*b* can be formed at the end parts of the interconnectors 200*a* and 200*b* on the side opposite to the first welding parts 210*a* and 210*b* in the second direction.

Next, a structure related to connection between the photoelectric conversion elements 10*a* and 10*b* will be described. In the following description, one of the photoelectric conversion elements 10*a* and 10*b* adjacent to each other may be referred to as a "first photoelectric conversion element", and the other of the photoelectric conversion elements 10*a* and 10*b* adjacent to each other may be referred to as a "second photoelectric conversion element". In the illustrated aspect, among the two photoelectric conversion elements adjacent to each other, the photoelectric conversion element 10*a* on the left side in the drawing is referred to as the "first photoelectric conversion element", and the photoelectric conversion element 10*b* on the right side in the drawing is referred to as the "second photoelectric conversion element". It should be noted that the terms "first photoelectric conversion element" and "second photoelectric conversion element" are merely used for convenience to distinguish the elements. Each of the first photoelectric conversion element and the second photoelectric conversion element may have the structure of the photoelectric conversion elements 10*a* and 10*b* described above. Therefore, the first photoelectric conversion element and the second photoelectric conversion element may be elements having the same structure.

In addition, in the following description, one of the plurality of interconnectors 200*a* and 200*b* may be referred to as a "first interconnector", and another one of the plurality of interconnectors 200*a* and 200*b* may be referred to as a "second interconnector". In the aspect shown in FIG. 2, the first interconnector 200*a* is provided below the first photoelectric conversion element 10*a*, and the second interconnector 200*b* is provided below the second photoelectric conversion element 10*b*. It should be noted that the terms "first interconnector" and "second interconnector" are merely used for convenience to distinguish the connectors. The first interconnector 200*a* and the second interconnector 200*b* may have the same structure.

The first interconnector 200*a* electrically connects the first photoelectric conversion element 10*a* to another photoelectric conversion element. In the aspect illustrated in FIG. 2, the first interconnector 200*a* electrically connects the first photoelectric conversion element 10*a* and a photoelectric conversion element partially drawn on the left side of the first photoelectric conversion element to each other.

The first interconnector 200*a* is connected to the first photoelectric conversion element 10*a* at the first welding part 210*a*. For example, the first interconnector 200*a* may be connected to the conductive substrate 20*a* of the first photoelectric conversion element 10*a* or a connection pad (not illustrated) provided at the conductive substrate 10*a* of the first photoelectric conversion element 10*a*, at the first welding part 210*a*.

The first interconnector 200*a* is connected to a photoelectric conversion element (a photoelectric conversion element partially illustrated on the left side of the first photoelectric conversion element 10*a* in FIG. 2) adjacent to the first photoelectric conversion element 10*a* at the second welding part 220*a*. The first interconnector 200*a* may be connected to the second electrode layer 24*a* provided in the photoelectric conversion element adjacent to the first photoelectric conversion element 10*a* or to the current-collecting electrode 30*a* (for example, the second portion 32*a* of the current-collecting electrode) directly or via a connection pad at the second welding part 220*a*, for example.

The second interconnector 200*b* electrically connects the first photoelectric conversion element 10*a* to still another second photoelectric conversion element 10*b*. The second interconnector 200*b* is connected to the first photoelectric conversion element 10*a* at the second welding part 220*b*. For example, the second interconnector 200*b* may be connected to the second electrode layer 24*a* of the first photoelectric conversion element 10*a* or the current-collecting electrode 30*a* of the first photoelectric conversion element 10*a* directly or via a connection pad at the second welding part 220*b*. In the aspect illustrated in FIG. 2, the second interconnector 200*b* is connected to the second portion 32*b* of the current-collecting electrode 30*a* of the first photoelectric conversion element 10*a* at the second welding part 220*b*.

The second interconnector 200*b* is connected to the second photoelectric conversion element 10*b* at the first welding part 210*b*. For example, the second interconnector 200*b* may be connected to a connection pad (not illustrated) provided at the conductive substrate 20*b* of the second photoelectric conversion element 10*b* or the conductive substrate 10*b* of the second photoelectric conversion element 10*b*, at the first welding part 210*b*.

The lengths of the interconnectors 200*a* and 200*b* in the second direction may be smaller than the lengths of the photoelectric conversion elements 10*a* and 10*b* in the second direction. As a result, the first interconnector 200*a* is provided into a region covered with the first photoelectric conversion element 10*a* when viewed from the thickness direction. In addition, the second interconnector 200*b* is provided into a region covered with the first photoelectric conversion element 10*b* when viewed from the thickness direction.

The first welding part 210*a* is provided on the first surface (lower surface in FIG. 2) of the first photoelectric conversion element 10*a*. In the first embodiment, the first welding part 210*a* provided in the first photoelectric conversion element 10*a* connects the first interconnector 200*a* and the first photoelectric conversion element 10*a*. The second welding part 220*b* provided in the first photoelectric conversion element 10*a* is provided on the second surface (upper surface in FIG. 2) of the first photoelectric conversion element 10*a*, the second surface being opposite to the first surface. In the first embodiment, the second welding part 220*b* provided in the first photoelectric conversion element 10*a* connects the second interconnector 200*b* and the first photoelectric conversion element 10*a*. Here, when viewed from the thickness direction perpendicular to the surface of the first photoelectric conversion element 10*a*, the center of gravity of the first welding part 210*a* provided in the first photoelectric conversion element 10*a* is shifted from the center of gravity of the second welding part 220*b* provided in the first photoelectric conversion element 10*a*.

In the present specification, the "center of gravity" of the welding part means the center of gravity in the two-dimensional shape of the welded region when viewed from the thickness direction. A "welding region" is defined by a region in which a welding target member (for example, interconnector) and the photoelectric conversion element are integrally joined by welding. Thus, when the welding part is, for example, circular or elliptical when viewed from the thickness direction, the "center of gravity" of the welding part coincides with the center of the circular or elliptical welding region.

When the center of gravity of the first welding part 210*a* provided in the first photoelectric conversion element 10*a* is shifted from the center of gravity of the second welding part 220*b* provided in the first photoelectric conversion element 10*a*, heat at the time of forming the first welding part 210*a* and heat at the time of forming the second welding part 220*b* are less likely to concentrate on the same portion of the first photoelectric conversion element 10*a*. As a result, it is possible to suppress an occurrence of a short circuit between the first welding part 210*a* and the second welding part 220*b*, that is, a short circuit between the first electrode layer 22*a* and the second electrode layer 24*a*. In addition, since excessive concentration of heat is suppressed, peeling and disconnection of the first interconnector 200*a* may also be suppressed.

When the thickness from the lower surface of the first electrode layer 22*a* to the upper surface of the second electrode layer 24*a* is small, and the center of gravity of the first welding part 210*a* provided in the first photoelectric conversion element 10*a* coincides with the center of gravity of the second welding part 220*b* provided in the first photoelectric conversion element 10*a* when viewed from the thickness direction, the first welding part 210*a* and the second welding part 220*b* are likely to be short-circuited due to the influence of heat during welding. In such a case, it is particularly preferable that the center of gravity of the first welding part 210*a* provided in the first photoelectric conversion element 10*a* be shifted from the center of gravity of the second welding part 220*b* provided in the first photoelectric conversion element 10*a* when viewed from the thickness direction.

Preferably, the entire first welding part 210*a* provided in the first photoelectric conversion element 10*a* is shifted from the center of gravity of the second welding part 220*b* provided in the first photoelectric conversion element 10*a* when viewed from the thickness direction. In this case, the first welding part 210*a* provided in the first photoelectric conversion element 10*a* does not overlap the center of gravity of the second welding part 220*b* provided in the first photoelectric conversion element 10*a* when viewed from the thickness direction. As a result, the heat during welding from both surfaces of the first photoelectric conversion element 10*a* is less likely to concentrate on the same portion, so that it is possible to further suppress an occurrence of a short circuit between the first electrode layer 22*a* and the second electrode layer 24*a* and peeling and disconnection of the first interconnector 200*a*.

More preferably, the entire first welding part 210*a* provided in the first photoelectric conversion element 10*a* is shifted from the entire second welding part 220*b* provided in the first photoelectric conversion element 10*a* when viewed from the thickness direction. In this case, the first welding part 210*a* provided in the first photoelectric conversion element 10*a* does not overlap the second welding part 220*b* provided in the first photoelectric conversion element 10*a* when viewed from the thickness direction. As a result, the heat during welding from both surfaces of the first photoelectric conversion element 10*a* is less likely to concentrate more on the same portion, so that it is possible to further suppress an occurrence of a short circuit between the first electrode layer 22*a* and the second electrode layer 24*a* and peeling and disconnection of the first interconnector 200*a*.

Preferably, the first welding parts 210*a* and 210*b* and the second welding parts 220*a* and 220*b* overlap the above-described non-photoelectric conversion region when viewed in the thickness direction (Z direction). As a result, it is possible to alleviate thermal damage to the photoelectric conversion layer 26*a* into the photoelectric convertible region due to heat generated when the welding part is formed. In the illustrated embodiment, the first welding parts 210*a* and 210*b* and the second welding parts 220*a* and 220*b* are provided in a region in which the first photoelectric conversion element 10*a* and the second photoelectric conversion element 10*b* overlap each other when viewed from the thickness direction (Z direction). More specifically, the first welding parts 210*a* and 210*b* and the second welding parts 220*a* and 220*b* are provided in a region overlapping the second portion 32*a* of the current-collecting electrode 30*a* when viewed from the thickness direction (Z direction).

As described above, the non-photoelectric conversion region of the photoelectric conversion element is desirably as small as possible. Thus, it is desirable that the first welding parts 210*a* and 210*b* and the second welding parts 220*a* and 220*b* are provided in a small non-photoelectric conversion region when viewed from the thickness direction. Even in such a case, as described above, it should be noted that the entire or center of gravity of the first welding parts 210*a* and 210*b* is disposed to be shifted from the entire or center of gravity of the second welding parts 220*b* and 220*b* when viewed from the thickness direction.

Figure 5:
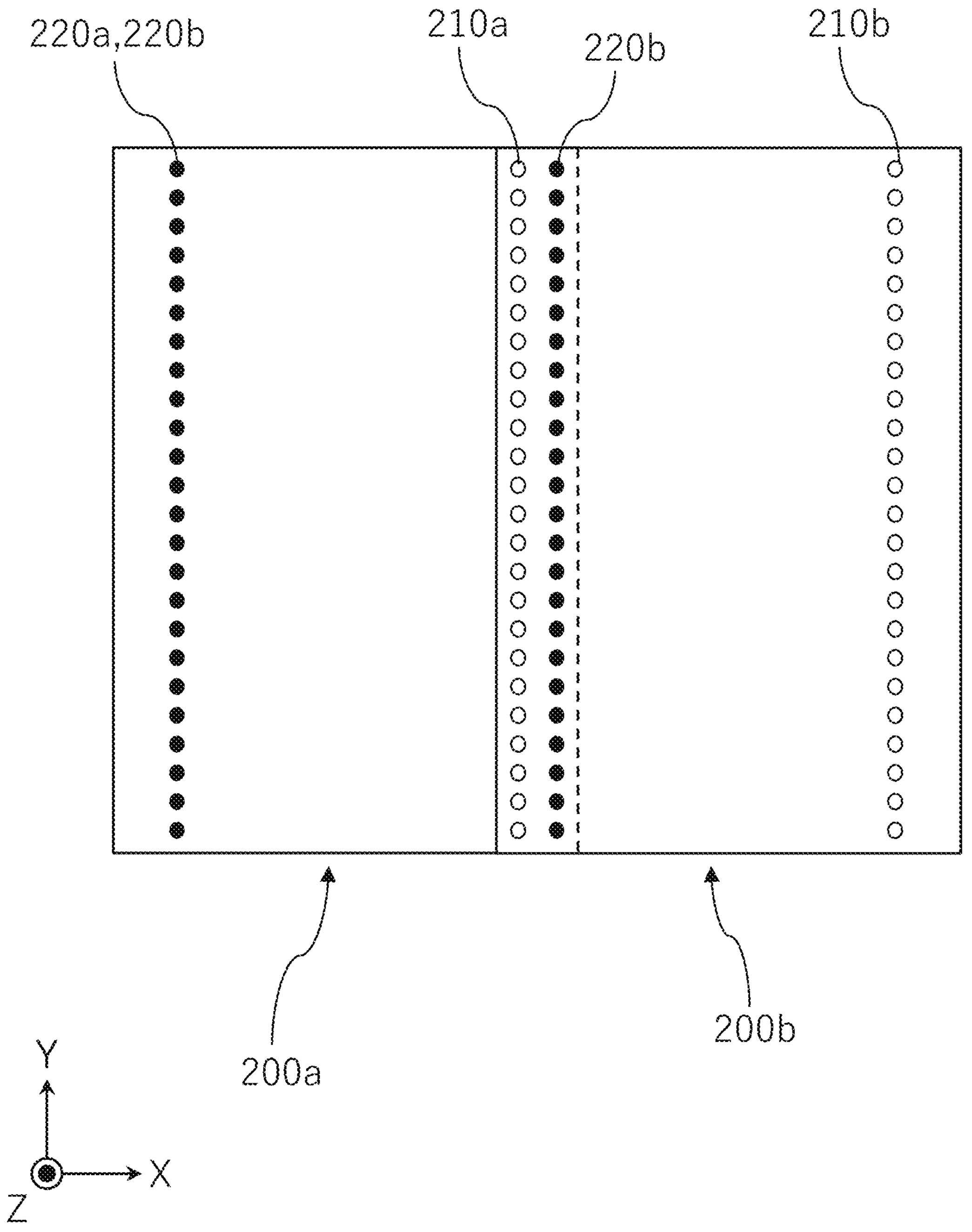
FIG. 5 is a schematic plan view illustrating an arrangement of interconnectors and positions of welding parts.

FIG. 5 is a schematic plan view illustrating an arrangement of interconnectors and positions of welding parts. In FIG. 5, only the positions of the first interconnector 200*a*, the second interconnector 200*b*, and the welding part in the photoelectric conversion module 100 illustrated in FIGS. 1 and 2 are illustrated in the thickness direction. FIG. 5 illustrates the positions of the first welding parts 210*a* and 210*b* and the second welding parts 220*a* and 220*b* provided in the first interconnector 200*a* and/or the second interconnector 200*b*. Here, in FIG. 5, the first welding parts 210*a* and 210*b* are drawn with white circles, and the second welding parts 220*a* and 220*b* are drawn with black circles (the same applies to FIGS. 7, 9, and 11 to 13). It should be noted that the first welding part 210*a* is provided in the first interconnector 200*a* and is actually at a position covered by the second interconnector 200*b*, but is clearly illustrated in FIG. 5 to clarify the positional relationship. These points to be noted regarding FIG. 5 are similar in FIG. 7 which will be described later.

In the first embodiment, as illustrated in FIG. 5, the photoelectric conversion module 100 includes at least a plurality of first welding parts 210*a* and a plurality of second welding parts 220*b*. The plurality of first welding parts 210*a* provided in the first photoelectric conversion element 10*a* may be provided side by side at intervals along the first direction. The plurality of second welding parts 220*b* provided on the first photoelectric conversion element 10*a* may be provided side by side at intervals along the first direction.

The first interconnector 200*a* partially overlaps the second interconnector 200*b* when viewed from the thickness direction. The plurality of first welding parts 210*a* of the first interconnector 200*a* and the plurality of second welding parts 220*b* of the second interconnector 200*b* are disposed to overlap the region in which the first interconnector 200*a* and the second interconnector 200*b* overlap when viewed from the thickness direction.

The plurality of second welding parts 220*b* of the second interconnector 200*b* are disposed to be shifted from the plurality of first welding parts 210*a* of the first interconnector 200*a* in the second direction. As a result, it is possible to reduce the interval between the plurality of first welding parts 210*a* provided side by side along the first direction as small as possible. Similarly, it is possible to reduce the interval between the plurality of second welding parts 220*b* provided side by side along the first direction as small as possible. Thus, it is possible to increase the connection strength of the interconnectors 200*a* and 200*b* to the first photoelectric conversion element 10*a*.

The configuration of the connection portion between the two photoelectric conversion elements 10*a* and 10*b* adjacent to each other and the vicinity thereof has been described above. The configuration related to the connection may be applied between any photoelectric conversion elements adjacent to each other.

The photoelectric conversion module 100 including the plurality of photoelectric conversion elements 10*a* and 10*b* may have a sealing material (not illustrated). The sealing material may be provided to seal all the plurality of photoelectric conversion elements 10*a* and 10*b* having the above-described configuration or the conductive substrates 20*a* and 20*b* of the plurality of photoelectric conversion elements 10*a* and 10*b*. In addition, the photoelectric conversion module 100 may have a support substrate (not illustrated) that supports all the plurality of photoelectric conversion elements 10*a* and 10*b* including the sealing material.

Next, an example of a method for manufacturing the photoelectric conversion module 100 according to the first embodiment will be described. First, the first photoelectric conversion elements 10*a* and the second photoelectric conversion element 10*b* including the first electrode layers 22*a* and 22*b*, the second electrode layers 24*a* and 24*b*, and the photoelectric conversion layers 26*a* and 26*b* between the first electrode layers 22*a* and 22*b* and the second electrode layers 24*a* and 24*b*, respectively, and the interconnectors 200*a* and 200*b* are prepared. The first photoelectric conversion element 10*a*, the second photoelectric conversion element 10*b*, and the interconnectors 200*a* and 200*b* may have the above-described structures.

Then, the first interconnector 200*a* is connected to the first surface of the first photoelectric conversion element 10*a* at the first welding part 210*a*, and the second interconnector 200*b* is connected to the second surface of the first photoelectric conversion element 10*a* at the second welding part 220*b*, the second surface being opposite to the first surface (welding step). In the welding step, as described above, the center of gravity of the first welding part 210*a* provided in the first photoelectric conversion element 10*a* is formed so as not to overlap the center of gravity of the second welding part 220*b* provided in the first photoelectric conversion element 10*a* when viewed from the thickness direction perpendicular to the above first surface of the first photoelectric conversion element 10*a*. More preferably, the first welding part 210*a* provided in the first photoelectric conversion element 10*a* does not overlap the entire second welding part 220*b* provided in the first photoelectric conversion element 10*a* or the center of gravity when viewed from the thickness direction perpendicular to the above first surface of the first photoelectric conversion element 10*a*. The welding method is not particularly limited, and may be, for example, a method such as parallel gap resistance welding.

In the welding step, preferably, the first welding part 210*a* and the second welding part 220*b* are simultaneously formed on both surfaces of the first photoelectric conversion element 10*a*. In this case, heat during welding is simultaneously applied from both the surfaces of the first photoelectric conversion element 10*a*. Even in this case, since the first welding part 210*a* or the center of gravity thereof does not overlap the entire or center of gravity of the second welding part 220*b* when viewed from the thickness direction, it is possible to suppress application of excessive heat to the same portion. As a result, it is possible to suppress an occurrence of a short circuit between the first electrode layer 22*a* and the second electrode layer 24*a* caused by excessive heat.

Then, the first photoelectric conversion element 10*a* and the second photoelectric conversion element 10*b* are disposed side by side to partially overlap each other, and similarly to the method described above, the interconnector only needs to be connected to the second photoelectric conversion element 10*b* by welding. By repeating the above connection step, a large number of photoelectric conversion elements can be joined side by side with each other.

Second Embodiment

Figure 6:
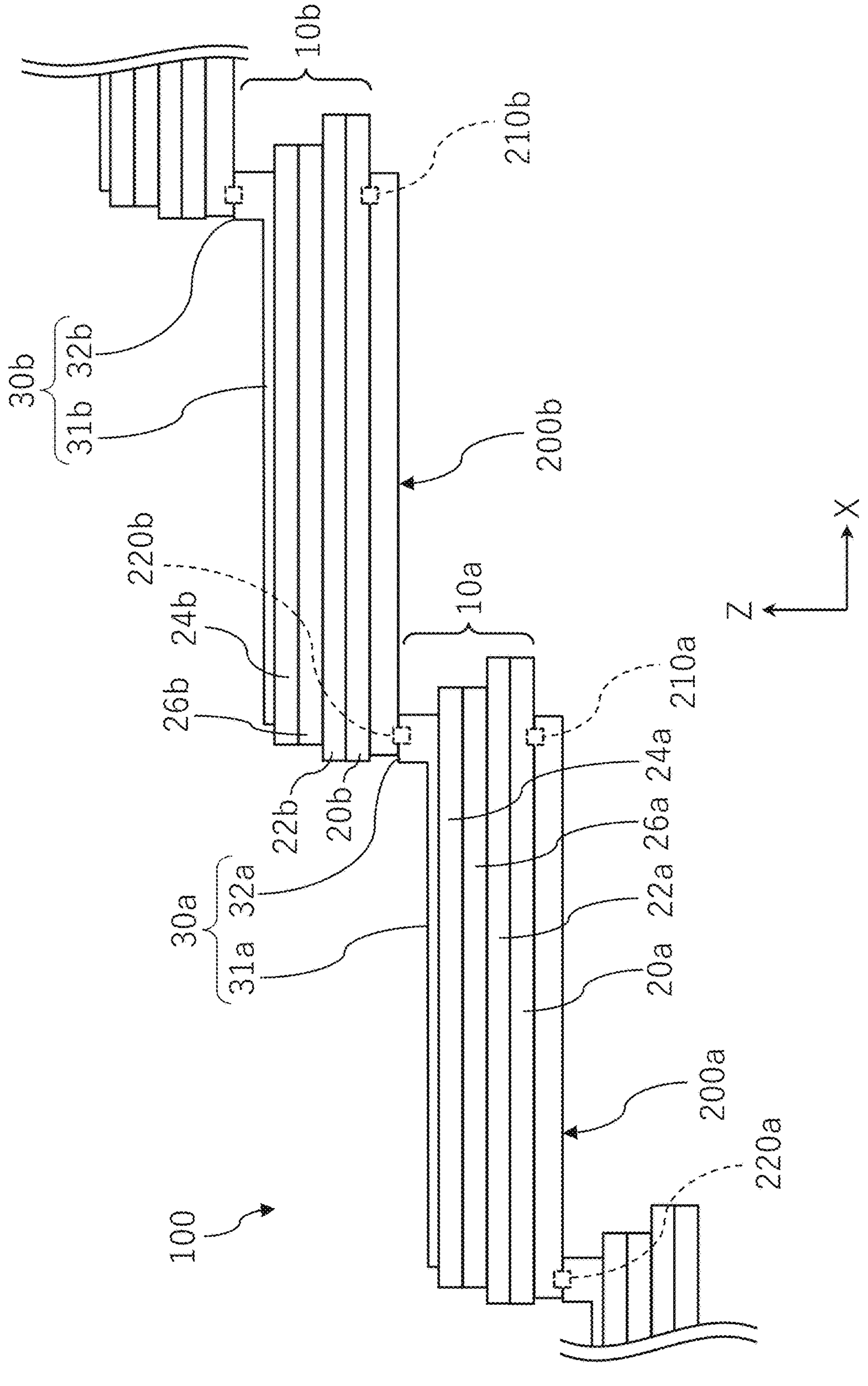
FIG. 6 is a schematic side view of a photoelectric conversion module according to a second embodiment.
Figure 7:
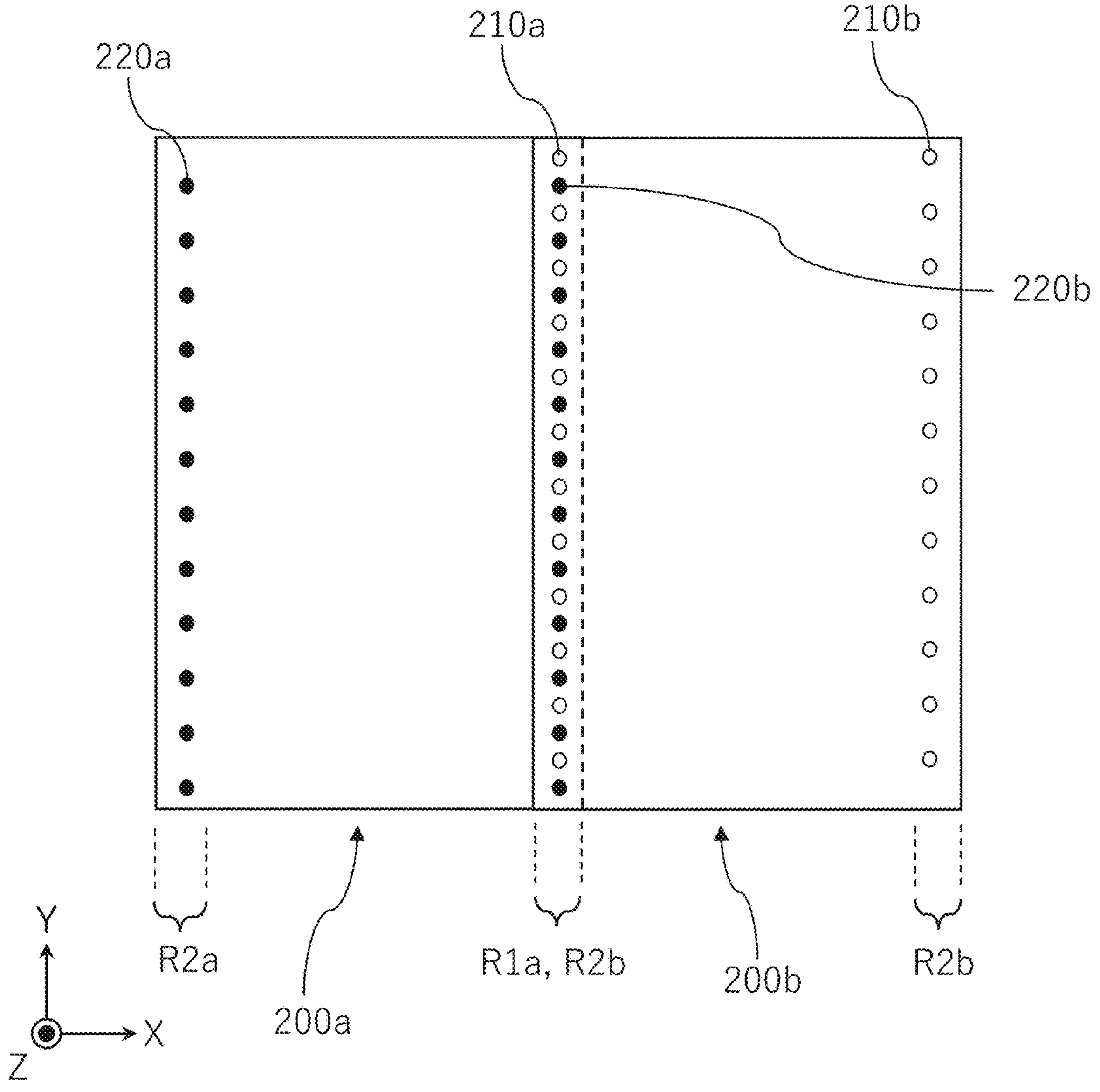
FIG. 7 is a schematic plan view illustrating an arrangement of interconnectors and positions of welding parts according to the second embodiment.

Next, a photoelectric conversion module according to a second embodiment will be described with reference to FIGS. 6 and 7. FIG. 6 is a schematic side view of the photoelectric conversion module according to the second embodiment. FIG. 7 is a schematic plan view illustrating an arrangement of interconnectors and positions of welding parts according to the second embodiment. The same components as those of the first embodiment are denoted by the same reference signs. It should be noted that the description of the same components as those of the first embodiment may be omitted.

In the second embodiment, as illustrated in FIG. 7, a photoelectric conversion module 100 includes at least a plurality of first welding parts 210*a* and a plurality of second welding parts 220*b*. The plurality of first welding parts 210*a* provided in the first photoelectric conversion element 10*a* may be provided side by side at intervals along the first direction. The plurality of second welding parts 220*b* provided on the first photoelectric conversion element 10*a* may be provided side by side at intervals along the first direction.

The first interconnector 200*a* partially overlaps the second interconnector 200*b* when viewed from the thickness direction. The plurality of first welding parts 210*a* and the plurality of second welding parts 220*b* provided in the first photoelectric conversion element 10*a* are disposed to overlap a region in which the first interconnector 200*a* and the second interconnector 200*b* overlap each other when viewed from the thickness direction.

In the second embodiment, the plurality of second welding parts 220*b* provided in the first photoelectric conversion element 10*a* are not disposed to be shifted from the plurality of first welding parts 210*a* in the second direction. Alternatively, the plurality of second welding parts 220*b* provided in the first photoelectric conversion element 10*a* are provided between the first welding parts 210*a* provided in the first photoelectric conversion element 10*a* in the first direction. That is, the plurality of second welding parts 220*b* provided in the first photoelectric conversion element 10*a* are disposed to be shifted from the plurality of first welding parts 210*a* provided in the first photoelectric conversion element 10*a* in the first direction. Even in this case, it is possible to alleviate the concentration of heat due to heat at the time of welding both the first welding part 210*a* and the first welding part 220*b*, and it is possible to suppress an occurrence of a short circuit between the first electrode layer and the second electrode layer.

In the second embodiment, the plurality of second welding parts 220*b* provided in the first photoelectric conversion element 10*a* are not disposed to be shifted from the plurality of first welding parts 210*a* provided in the first photoelectric conversion element 10*a* in the second direction. Therefore, it is possible to reduce the width (width in the second direction) of the region in which the first interconnector 200*a* and the second interconnector 200*b* overlap each other when viewed from the thickness direction, as small as possible. That is, it is possible to reduce the width of the non-photoelectric conversion region of the first photoelectric conversion element 10*a*.

The other components and the method for manufacturing the photoelectric conversion module are similar to those of the first embodiment, and thus the description thereof will be omitted.

Third Embodiment

Figure 8:
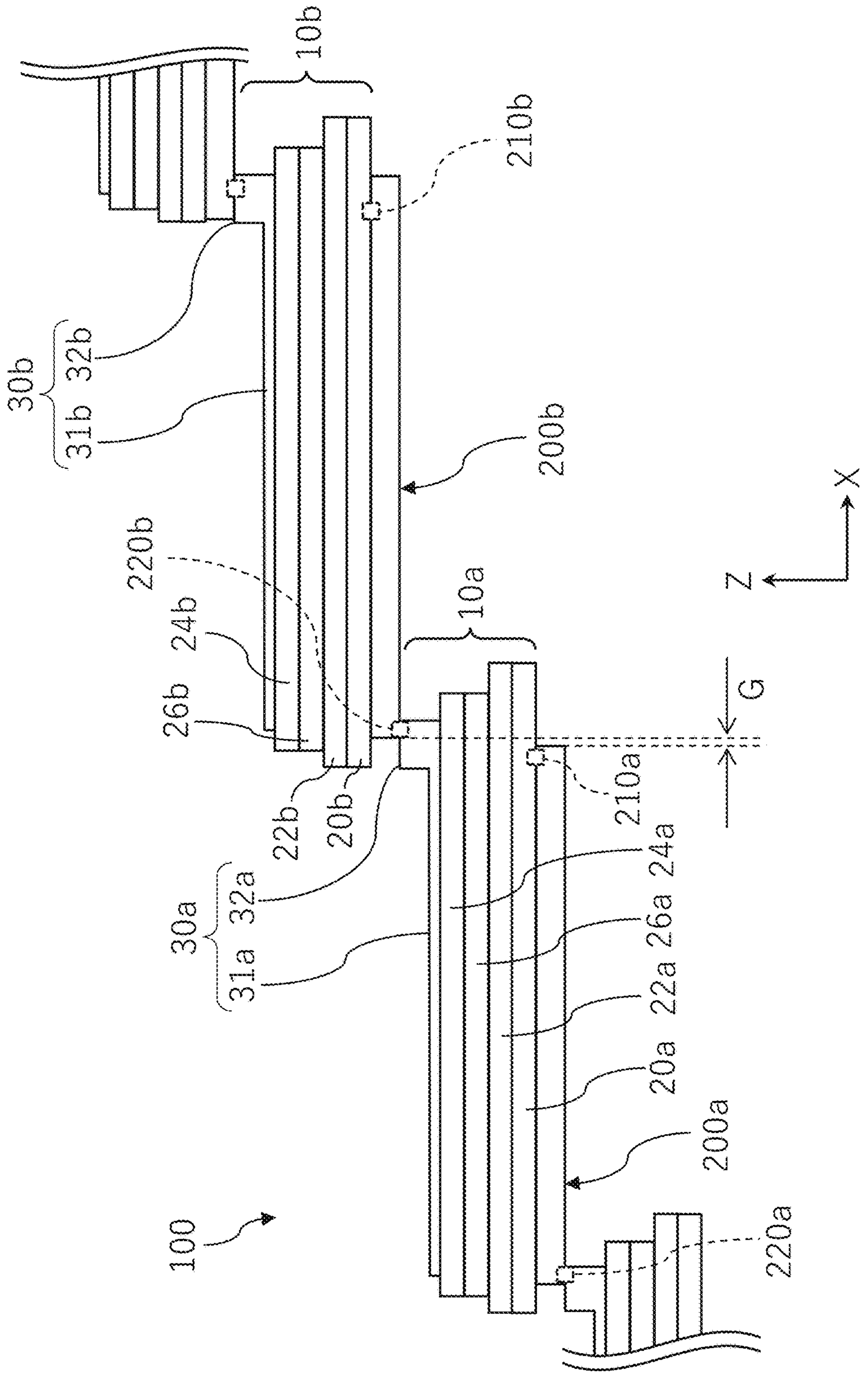
FIG. 8 is a schematic side view of a photoelectric conversion module according to a third embodiment.
Figure 9:
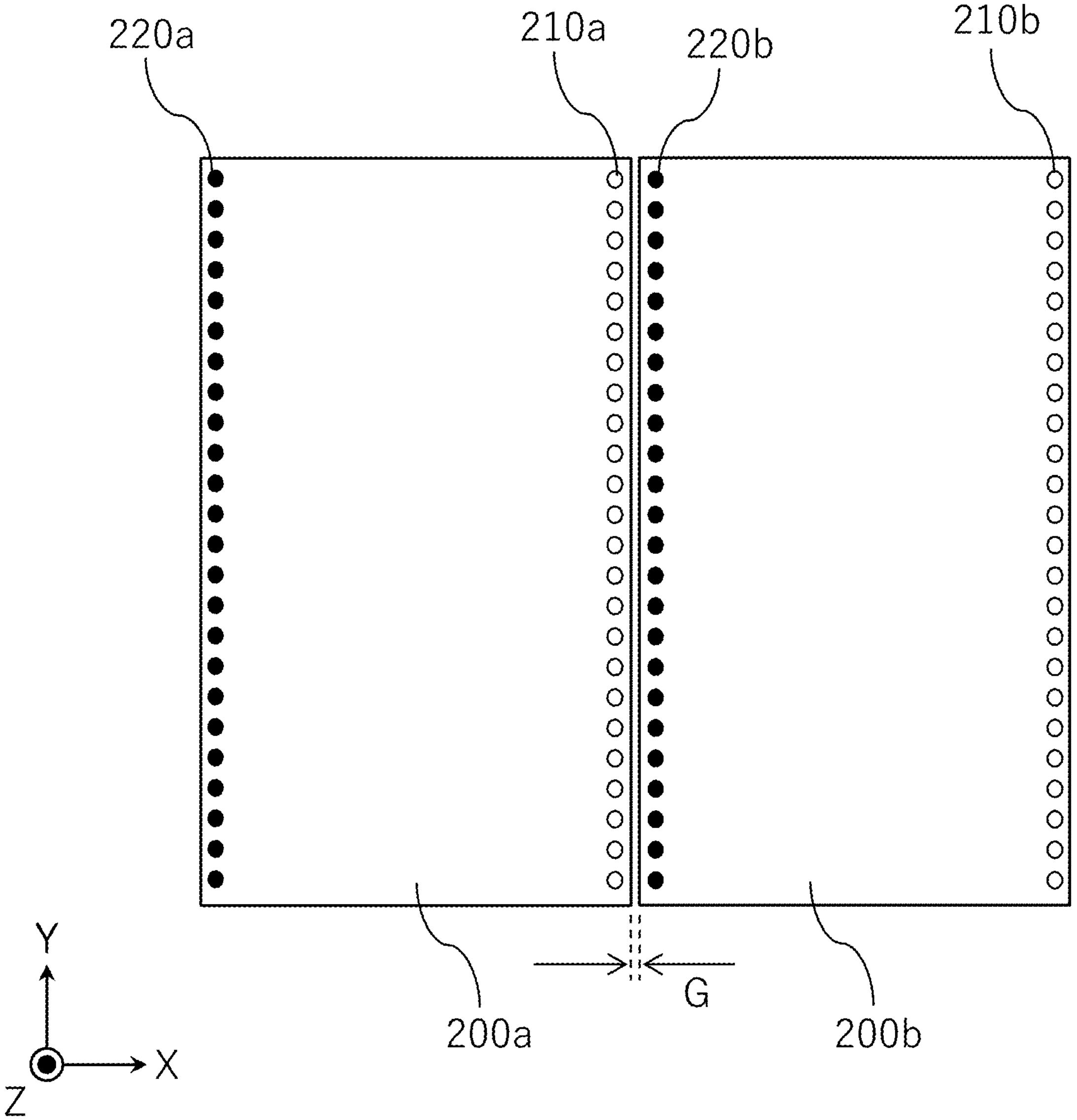
FIG. 9 is a schematic plan view illustrating an arrangement of interconnectors and positions of welding parts according to the third embodiment.

Next, a photoelectric conversion module according to a third embodiment will be described with reference to FIGS. 8 and 9. FIG. 8 is a schematic side view of the photoelectric conversion module according to the third embodiment. FIG. 9 is a schematic plan view illustrating an arrangement of interconnectors and positions of welding parts according to the third embodiment. The same components as those of the first embodiment are denoted by the same reference signs. It should be noted that the description of the same components as those of the first embodiment may be omitted.

As illustrated in FIG. 9, a photoelectric conversion module 100 includes at least a plurality of first welding parts 210*a* and a plurality of second welding parts 220*b*. The plurality of first welding parts 210*a* provided in the first photoelectric conversion element 10*a* may be provided side by side at intervals along the first direction. The plurality of second welding parts 220*b* provided on the first photoelectric conversion element 10*a* may be provided side by side at intervals along the first direction.

In the third embodiment, a first interconnector 200*a* is disposed at an interval G from a second interconnector 200*b* in the second direction. Thus, the first interconnector 200*a* does not overlap the second interconnector 200*b* when viewed from the thickness direction. As a result, the plurality of second welding parts 220*b* formed in the second interconnector 200*b* are naturally disposed to be shifted from the plurality of first welding parts 210*a* formed in the first interconnector 200*a*.

Even in this case, it is desirable that the first welding part 210*a* and the second welding part 220*b* are formed in the non-photoelectric conversion region.

Fourth Embodiment

Figure 10:
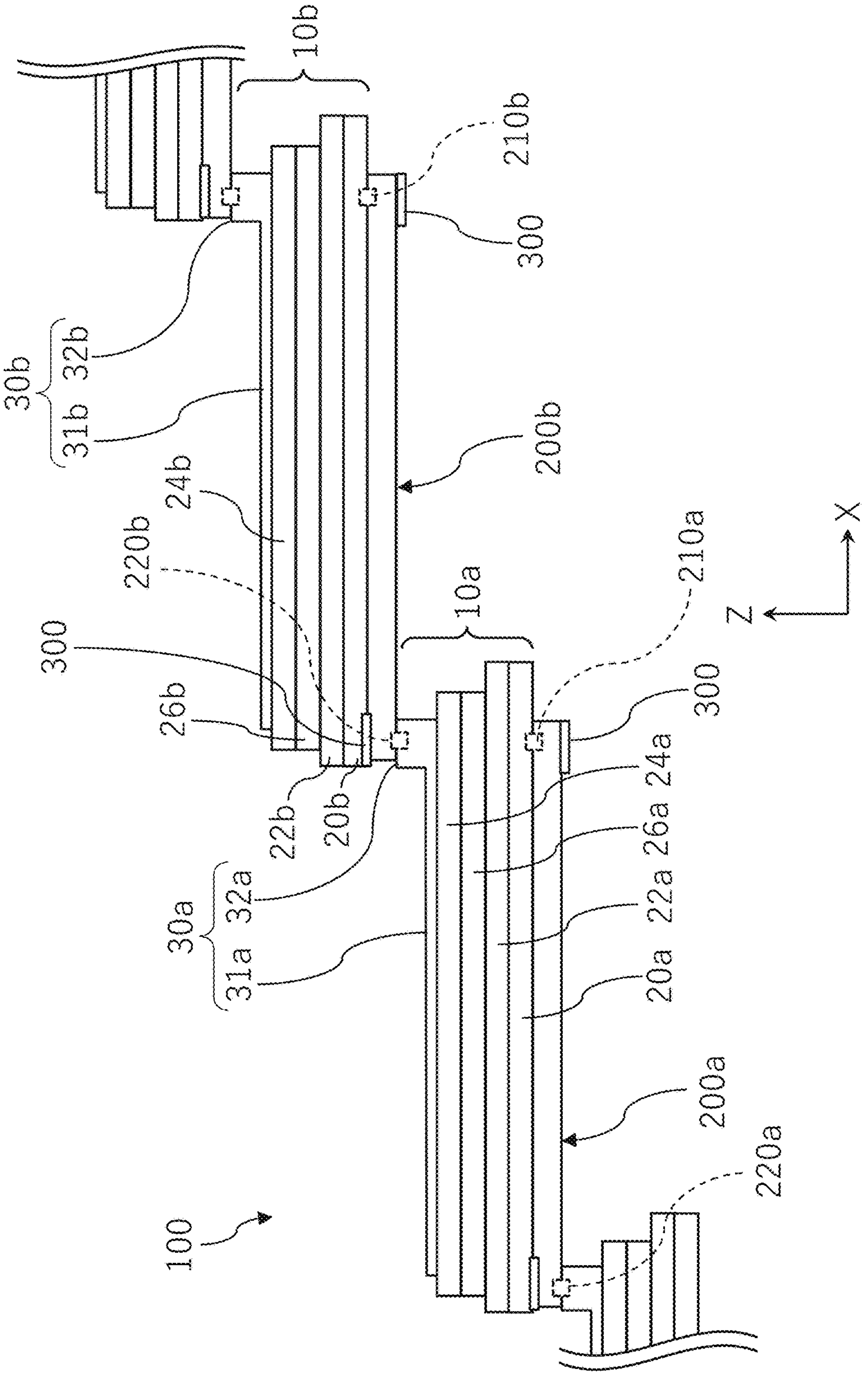
FIG. 10 is a schematic side view of a photoelectric conversion module according to a fourth embodiment.
Figure 11:
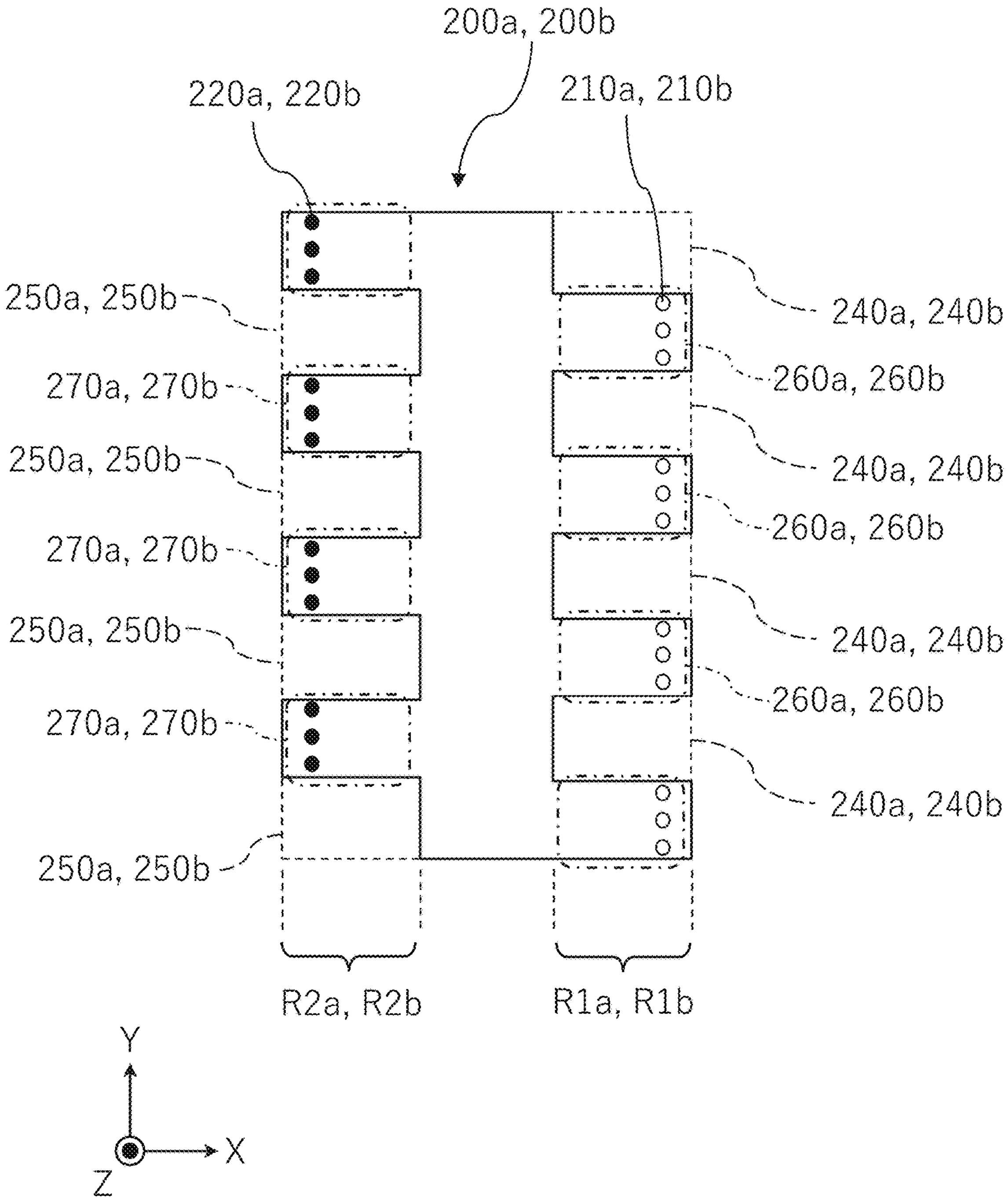
FIG. 11 is a schematic plan view of each interconnector according to the fourth embodiment.
Figure 12:
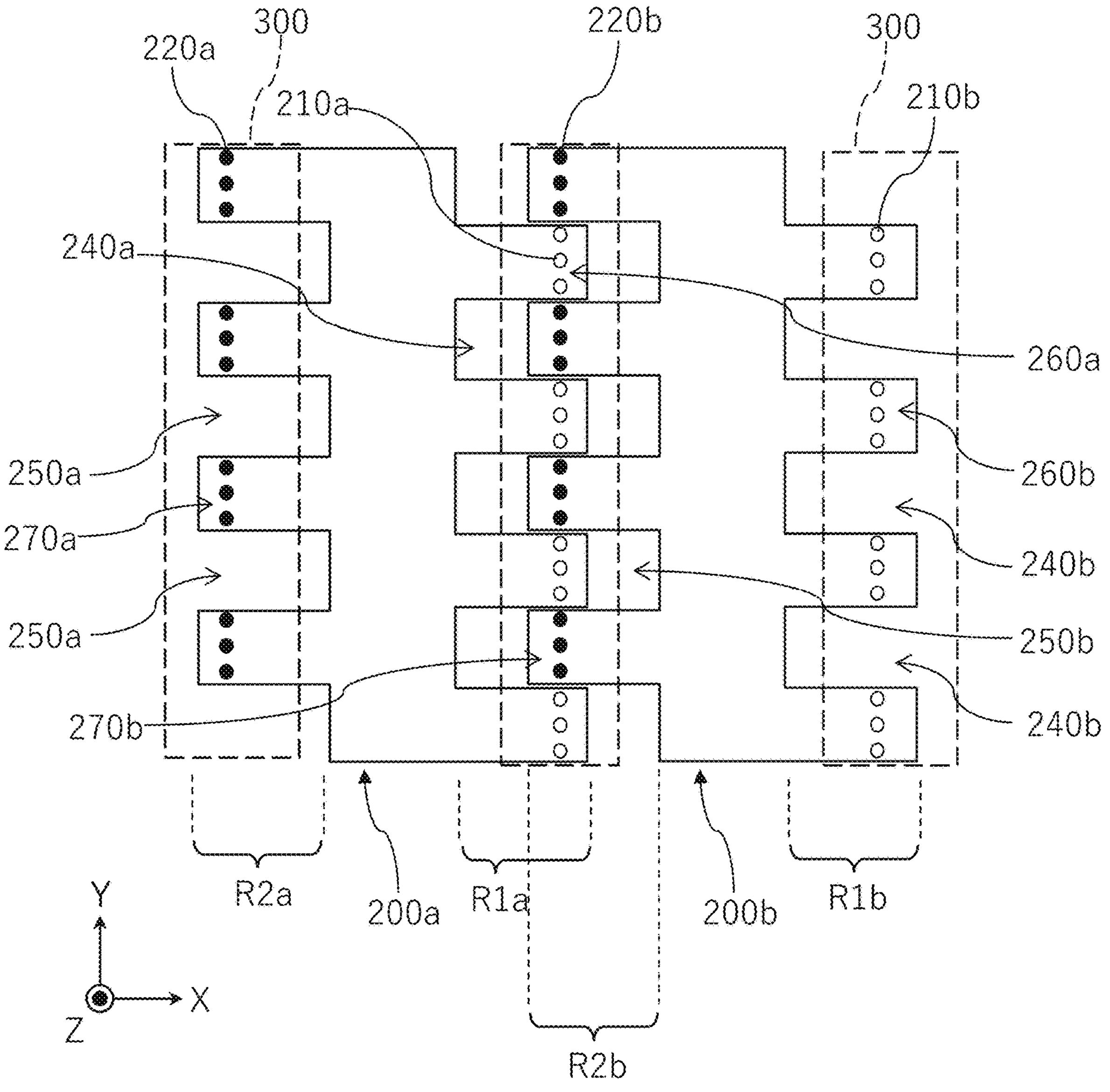
FIG. 12 is a schematic plan view illustrating an arrangement of interconnectors and positions of welding parts according to the fourth embodiment.

Next, a photoelectric conversion module according to a fourth embodiment will be described with reference to FIGS. 10, 11, and 12. FIG. 10 is a schematic side view of the photoelectric conversion module according to the fourth embodiment. FIG. 11 is a schematic plan view of each interconnector according to the fourth embodiment. FIG. 12 is a schematic plan view illustrating arrangement of interconnectors and positions of welding parts according to the fourth embodiment. The same components as those of the first embodiment are denoted by the same reference signs. It should be noted that the description of the same components as those of the first embodiment may be omitted.

In the fourth embodiment, the shapes of interconnectors 200*a* and 200*b* are different from those of the first embodiment.

Each of the interconnectors 200*a* and 200*b* may have at least one of first absence parts 240*a* and 240*b* provided adjacent to the first weldable parts 260*a* and 260*b* and at least one of second absence parts 250*a* and 250*b* provided adjacent to the second weldable parts 270*a* and 270*b*. The second absence parts 250*a* and 250*b* may be provided at positions separated from the first absence parts 240*a* and 240*b* in the second direction.

The first absence parts 240*a* and 240*b* and/or the second absence parts 250*a* and 250*b* may be notches formed at ends of the interconnectors 200*a* and 200*b* or holes formed in the interconnectors 200*a* and 200*b*. In the fourth embodiment, the first absence parts 240*a* and 240*b* and the second absence parts 250*a* and 250*b* are notches formed at ends of the interconnectors 200*a* and 200*b*. In this case, the second absence parts 250*a* and 250*b* are preferably provided at ends opposite to the ends of the interconnectors 200a and 200b having the first absence parts 240a and 240b.

The interconnectors 200a and 200b may have a shape obtained by removing the first absence parts 240a and 240b and the second absence parts 250a and 250b from a substantially rectangular or substantially square shape. In other words, when the shapes of the first absence parts 240a and 240b and the second absence parts 250a and 250b are added to the shapes of the interconnectors 200a and 200b, a substantially rectangular shape or a substantially square shape is obtained.

In the fourth embodiment, the first absence parts 240a and 240b and the second absence parts 250a and 250b are substantially rectangular or substantially square notches provided at the ends of the interconnectors 200a and 200b. A plurality of first absence parts 240a and 240b and a plurality of second absence parts 250a and 250b are provided at intervals along the first direction. That is, a plurality of notches are formed at the ends of the interconnectors 200a and 200b in the second direction at intervals along the first direction. As a result, both ends of the interconnectors 200a and 200b in the second direction have a rectangular wave shape.

The interconnectors 200a and 200b may have first regions R1a and R1b including first weldable parts 260a and 260b and the first absence parts 240a and 240b, and second regions R2a and R2b including at least second weldable parts 270a and 270b. In the example illustrated in FIG. 11, the interconnectors 200a and 200b include the first regions R1a and R1b including the first weldable parts 260a and 260b and the first absence parts 240a and 240b, and the second regions R2a and R2b including the second weldable parts 270a and 270b and the second absence parts 250a and 250b.

In the fourth embodiment, the first regions R1a and R1b are regions corresponding to end parts of the interconnectors 200a and 200b in the second direction. The second regions R2a and R2b are regions corresponding to end parts of the interconnectors 200a and 200b opposite to the first regions R1a and R1b. The first regions R1a and R1b may be regions extending from one ends to the other ends of the interconnectors 200a and 200b in the first direction. Similarly, the second regions R2a and R2b may be regions extending from one ends to the other ends of the interconnectors 200a and 200b in the first direction.

As illustrated in FIGS. 10 and 12, when the photoelectric conversion elements 10a and 10b are joined to each other by the plurality of interconnectors 200a and 200b, the first regions R1a and R1b and the second regions R2a and R2b of the interconnectors 200a and 200b may be regions overlapping the first regions R1a and R1b and the second regions R2a and R2b of the other interconnectors 200a and 200b when viewed from the thickness direction.

In the first regions R1a and R1b and the second regions R2a and R2b, the first absence parts 240a and 240b and the second absence parts 250a and 250b are provided adjacent to the first weldable parts 260a and 260b and the second weldable parts 270a and 270b, respectively. In the fourth embodiment, the first absence parts 240a and 240b and the second absence parts 250a and 250b are adjacent to the first weldable parts 260a and 260b and the second weldable parts 270a and 270b, in the first direction intersecting the second direction, respectively. Thus, at the time of welding the interconnectors 200a and 200b, the first welding parts 210a and 210b and the second welding parts 220a and 220b are disposed at positions adjacent to the first absence parts 240a and 240b and the second absence parts 250a and 250b, respectively. Thus, the heat during welding is easily dissipated, and it is possible to alleviate the load near the welding parts of the interconnectors 200a and 200b.

Preferably, the first absence parts 240a and 240b and/or the second absence parts 250a and 250b are provided to divide the first weldable parts 260a and 260b and/or the second weldable parts 270a and 270b into a plurality of sections in the first direction, respectively. Specifically, the first absence parts 240a and 240b may be located between the first weldable parts 260a and 260b provided side by side in the first direction, and the second absence parts 250a and 250b may be located between the second weldable parts 270a and 270b provided side by side in the first direction. More preferably, in the first regions R1a and R1b, the first absence parts 240a and 240b and the first weldable parts 260a and 260b may be alternately provided side by side in the first direction. Similarly, in the second regions R2a and R2b, the second absence parts 250a and 250b and the second weldable parts 270a and 270b may be alternately provided side by side in the first direction. As a result, at the time of welding the interconnectors 200a and 200b, the plurality of first welding parts 210a and 210b and the plurality of second welding parts 220a and 220b are separated by the first absence parts 240a and 240b and the second absence parts 250a and 250b, respectively. That is, the first welding parts 210a and 210b and the first absence parts 240a and 240b are alternately provided side by side in the first direction. Similarly, the second welding parts 220a and 220b and the second absence parts 250a and 250b are alternately provided side by side in the first direction. Thus, heat generated in the first welding parts 210a and 210b and the second welding parts 220a and 220b during welding is easily dissipated.

In the fourth embodiment, when the first regions R1a and R1b and the second regions R2a and R2b overlap each other in the thickness direction by shifting the interconnectors 200a and 200b having the same shape in the second direction, the first absence parts 240a and 240b are formed to overlap the second weldable parts 270a and 270b, and the second absence parts 250a and 250b are formed to overlap the first weldable parts 260a and 260b.

In the aspect illustrated in FIG. 11, when the first regions R1a and R1b and the second regions R2a and R2b of the interconnectors 200a and 200b overlap each other in the thickness direction, the rectangular wave-shaped edge of the interconnectors 200a and 200b in the second direction on the right side in the drawing meshes with the rectangular wave-shaped edge of the interconnectors 200a and 200b in the second direction on the left side in the drawing in plan view when viewed from the thickness direction (see also FIG. 12).

In the fourth embodiment, the first region R1a of the first interconnector 200a overlaps the second region R2b of the second interconnector 200b when viewed from the thickness direction perpendicular to the surfaces of the photoelectric conversion elements 10a and 10b. Here, as described above, when the first regions R1a and R1b and the second regions R2a and R2a of the interconnectors 200a and 200b having the same shape overlap each other in the thickness direction, the first absence parts 240a and 240b are formed to overlap the second weldable parts 270a and 270b. Thus, as illustrated in FIG. 12, the second weldable part 270b of the second interconnector 200b is disposed at a position overlapping the first absence part 240a of the first interconnector 200a. That is, the shape of the rectangular wave in the second direction of the first interconnector 200a on the right side in the drawing meshes with the shape of the rectangular wave in the second direction of the second interconnector

200*b* on the left side in the drawing in plan view when viewed from the thickness direction.

Thus, when the second welding part 220*b* is formed at a position of the second weldable part 270*b* of the second interconnector 200*b*, the position overlapping the first absence part 240*a* of the first interconnector 200*a*, the second welding part 220*b* is naturally disposed at a position shifted from the first welding part 210*a* formed in the first interconnector 200*a*. As described above, the positions of the first welding part 210*a* and the second welding part 220*b* can be shifted more reliably by the shapes of the interconnectors 200*a* and 200*b*.

In addition, in the photoelectric conversion module 100, as illustrated in FIG. 10, an insulating tape 300 covering the first welding parts 210*a* and 210*b* and the second welding parts 220*a* and 220*b* may be stuck to the first interconnector 200*a* and/or the second interconnector 200*b*. The region to which the insulating tape 300 is stuck is indicated by a broken line in FIG. 12. That is, the insulating tape 300 extends from the welding parts 210*a*, 210*b*, 220*a*, and 220*b* of the interconnectors 200*a* and 200*b* to the absence parts 240*a*, 240*b*, 250*a*, and 250*b* in the first direction. Since the absence parts 240*a*, 240*b*, 250*a*, and 250*b* are regions where the interconnectors 200*a* and 200*b* do not exist, the insulating tape 300 adheres to both portions of the photoelectric conversion elements 10*a* and 10*b*, which are not covered with the interconnectors 200*a* and 200*b* and the interconnectors 220*a* and 220*b*. As a result, since the interconnectors 200*a* and 200*b* are stuck to the photoelectric conversion elements 10*a* and 10*b* by the insulating tape 300, the connection strength to the photoelectric conversion elements 10*a* and 10*b* may be further improved.

Fifth Embodiment

Figure 13:
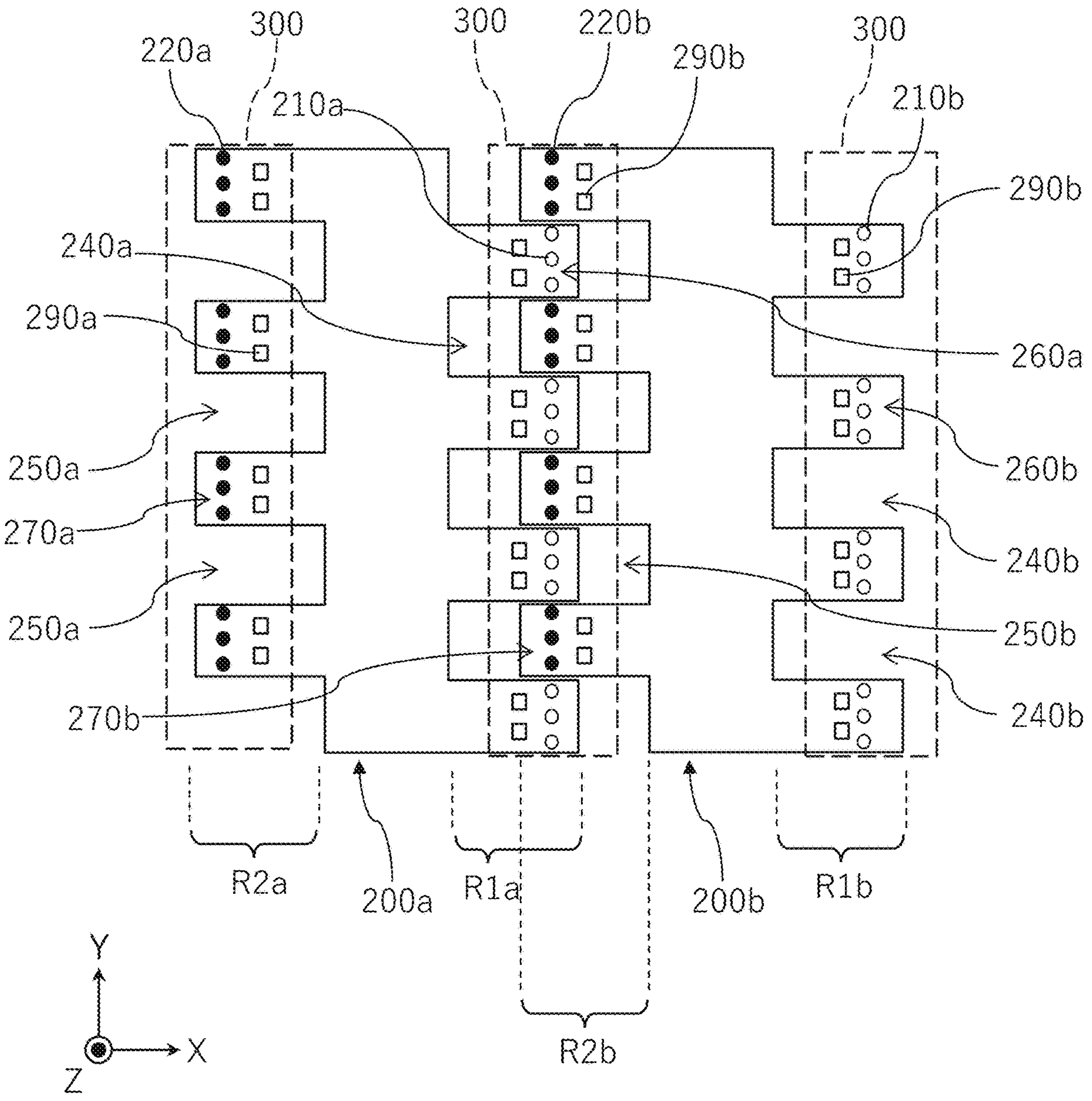
FIG. 13 is a schematic plan view illustrating an arrangement of interconnectors and positions of welding parts according to a fifth embodiment.

Next, a photoelectric conversion module according to a fifth embodiment will be described with reference to FIG. 13. FIG. 13 is a schematic plan view illustrating an arrangement of interconnectors and positions of welding parts according to the fifth embodiment. The same components as those of the first embodiment are denoted by the same reference signs. It should be noted that the description of the same components as those of the first embodiment may be omitted.

In the fifth embodiment, as illustrated in FIG. 13, the shapes of interconnectors 200*a* and 200*b* and the positions of welding parts 210*a*, 220*a*, 210*b*, and 220*b* are substantially the same as those described in the fourth embodiment. The interconnectors 200*a* and 200*b* according to the fifth embodiment have a plurality of hole parts 290*a* and 290*b*. The plurality of hole parts 290*a* and 290*b* are provided in a region covered with the insulating tape 300. Thus, the insulating tape 300 covering the plurality of hole parts 290*a* and 290*b* also adheres to the portions of the photoelectric conversion elements 10*a* and 10*b* exposed from the hole parts 290*a* and 290*b*. Therefore, the connection strength of the interconnectors 200*a* and 200*b* to the photoelectric conversion elements 10*a* and 10*b* may be further improved.

Sixth Embodiment

Figure 14:
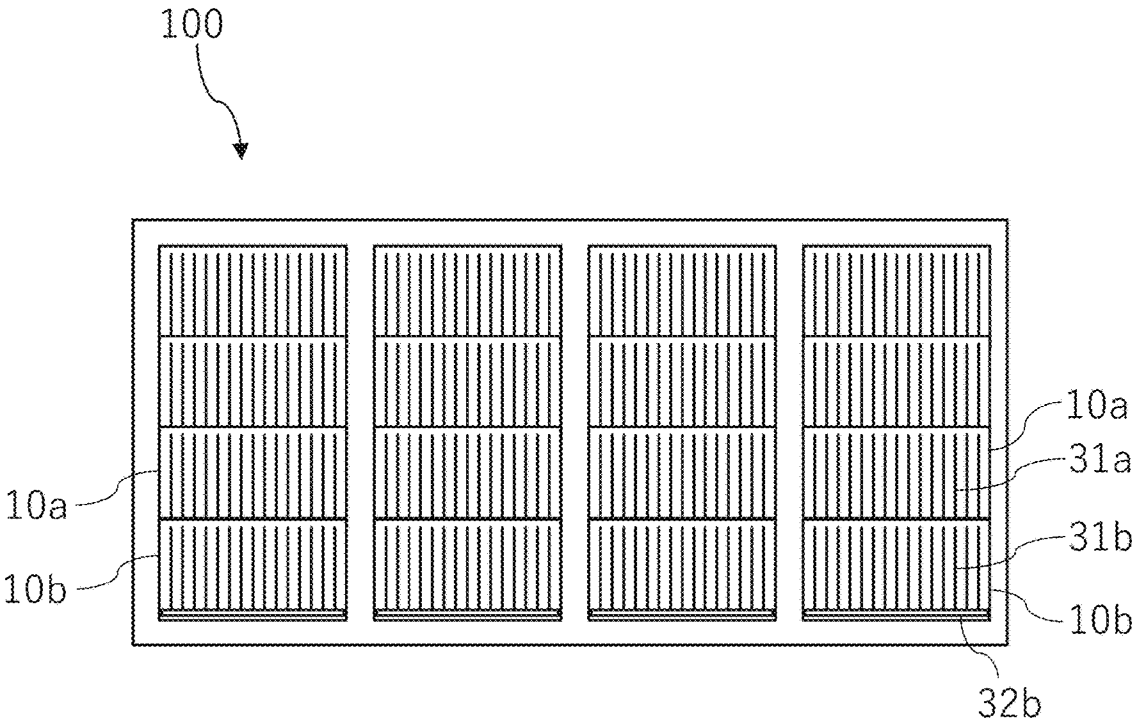
FIG. 14 is a schematic plan view of a photoelectric conversion module according to a sixth embodiment.

Next, a photoelectric conversion module according to a sixth embodiment will be described with reference to FIG. 14. FIG. 14 is a schematic plan view of the photoelectric conversion module according to the sixth embodiment. The same components as those of the first embodiment are denoted by the same reference signs. It should be noted that the description of the same components as those of the first embodiment may be omitted.

A photoelectric conversion module 100 may include one or a plurality of photoelectric conversion elements 10*a* and 10*b*. FIG. 14 illustrates the photoelectric conversion module 100 including a plurality of photoelectric conversion elements 10*a* and 10*b*. The one or more photoelectric conversion elements 10*a* and 10*b* may be sealed with, for example, a sealing material.

When the photoelectric conversion module 100 includes the plurality of photoelectric conversion elements 10*a* and 10*b*, the plurality of photoelectric conversion elements 10*a* and 10*b* may be provided side by side in at least one direction, and preferably may be provided side by side in a lattice pattern. In this case, the plurality of photoelectric conversion elements 10*a* and 10*b* may be electrically connected to each other in series and/or in parallel.

In the example illustrated in FIG. 14, adjacent photoelectric conversion elements among the photoelectric conversion elements 10*a* and 10*b* provided side by side in one direction partially overlap each other. Specifically, as illustrated in FIG. 14, the second photoelectric conversion element 10*b* may be disposed to cover a second portion 32*a* of a current-collecting electrode 30*a* of the first photoelectric conversion element 10*a* adjacent thereto. In this case, the second photoelectric conversion element 10*b* is electrically connected to the second portion 32*a* of the current-collecting electrode 30*a* of the first photoelectric conversion element 10*a* adjacent thereto.

The photoelectric conversion elements 10*a* and 10*b* adjacent to each other may be electrically connected to each other by the interconnectors 200*a* and 200*b* described above. In this case, the interconnectors 200*a* and 200*b* may extend across the photoelectric conversion elements 10*a* and 10*b* adjacent to each other.

Instead of the aspect illustrated in FIG. 14, the photoelectric conversion elements 10*a* and 10*b* adjacent to each other may be disposed at intervals. Even in this case, the photoelectric conversion elements 10*a* and 10*b* adjacent to each other can be electrically connected to each other by the interconnectors 200*a* and 200*b*.

[Artificial Satellite and Paddle for Artificial Satellite]

Figure 15:
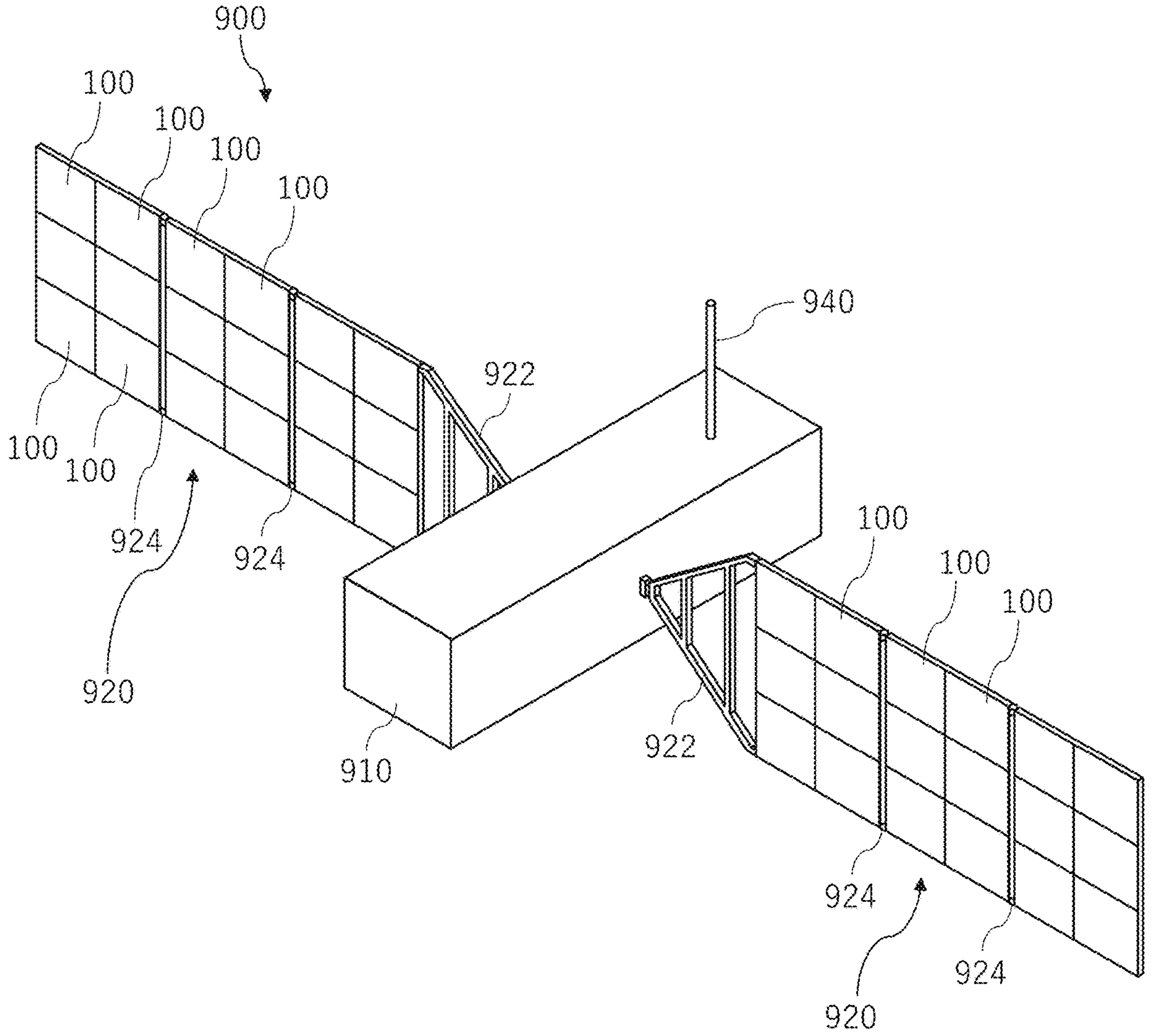
FIG. 15 is a schematic perspective view of an artificial satellite including the photoelectric conversion module.

Next, an artificial satellite including the photoelectric conversion module and a paddle for the artificial satellite will be described. FIG. 15 is a schematic perspective view of an artificial satellite including the photoelectric conversion module. An artificial satellite 900 may have a base 910 and a paddle 920. The base 910 may include a device (not illustrated) necessary for controlling the artificial satellite 900 and the like. An antenna 940 may be attached to the base 910.

The paddle 920 may include the photoelectric conversion module 100 described above. The paddle 920 including the photoelectric conversion module 100 can be used as a power source for operating various devices provided in the base 910. As described above, the photoelectric conversion module 100 can be applied to a paddle for an artificial satellite. In particular, since the paddle 920 for an artificial satellite is exposed to a high temperature environment and a severe temperature change environment at the time of launching and operating the artificial satellite, it is desirable to use the photoelectric conversion module 100 including the photoelectric conversion elements 10*a* and 10*b* having high heat resistance described above.

The paddle 920 may include a joining part 922 and a hinge part 924. The joining part 922 corresponds to a portion joining the paddle 920 to the base 910.

The hinge part 924 extends along one direction, and the paddle 920 can be bent with the hinge part 924 as a rotation axis. Each paddle 920 may have at least one, preferably a plurality of, hinge parts 924. As a result, the paddle 920 including the photoelectric conversion module 100 is configured to be small and foldable. When the artificial satellite 900 is launched, the paddle 920 may be in a folded state. The paddle 920 may be deployed when receiving sunlight to generate power.

Instead of the structure as illustrated in FIG. 15, the paddle 920 may have a cylindrical shape formed by being wound. As a result, the paddle 920 may take a substantially flat deployed state by the rotation of the wound portion. When the artificial satellite 900 is launched, the paddle 920 may maintain a generally cylindrical shape. The paddle 920 only needs to be deployed to be in a substantially flat state when receiving sunlight to generate power.

As described above, the contents of the present invention have been disclosed through the embodiments, but it should not be understood that the description and the drawings constituting a part of the disclosure limit the present invention. From this disclosure, various alternative embodiments, examples, and operational techniques will become apparent to those skilled in the art. Therefore, the technical scope of the present invention is defined only by the matters specifying the invention according to the claims appropriate from the above description.

Each feature described in each of the above-described embodiments may be applied to or replaced with another embodiment as much as possible. In the above embodiments, the thin-film photoelectric conversion element has been described as an example, but the present invention is not limited thereto, and can be applied to a crystalline photoelectric conversion element as much as possible.

In the embodiments described above, the first welding part 210*a* and the second welding part 220*b* provided in the first photoelectric conversion element 10*a* are used for connection of the interconnectors 200*a* and 200*b*. Alternatively, the first welding part 210*a* and the second welding part 220*b* may be used for connection of another any member. In this case, the welding step in the method for manufacturing the photoelectric conversion module only needs to include forming the first welding part on the first surface of the photoelectric conversion element and forming the second welding part on the second surface of the photoelectric conversion element opposite to the first surface. As described above, the first welding part is formed such that the center of gravity of the first welding part is shifted from the center of gravity of the second welding part. Preferably, the first welding part does not overlap the center of gravity or the entire second welding part when viewed from the thickness direction of the photoelectric conversion element.

The invention claimed is:

1. A photoelectric conversion module comprising:
- a first photoelectric conversion element;
- a first welding part provided on a first surface of the first photoelectric conversion element;
- a second welding part provided on a second surface of the first photoelectric conversion element, the second surface being opposite to the first surface, and
- a second photoelectric conversion element partially overlapping the first photoelectric conversion element over the first surface of the first photoelectric conversion element, wherein
- a center of gravity of the first welding part is shifted from a center of gravity of the second welding part when viewed from a thickness direction perpendicular to the first surface of the first photoelectric conversion element, and
- the first welding part and the second welding part overlap a region covered by the second photoelectric conversion element when viewed from the thickness direction.

2. The photoelectric conversion module according to claim 1, wherein the first welding part does not overlap the center of gravity of the second welding part when viewed from the thickness direction.

3. The photoelectric conversion module according to claim 1, wherein the first welding part does not overlap the second welding part when viewed from the thickness direction.

4. The photoelectric conversion module according to claim 1, wherein
- the photoelectric conversion module includes a plurality of the first welding parts and a plurality of the second welding parts,
- the plurality of first welding parts are arranged at intervals along a first direction, and
- the plurality of second welding parts are shifted from the first welding parts in a second direction intersecting the first direction.

5. The photoelectric conversion module according to claim 1, wherein
- the photoelectric conversion module includes a plurality of the first welding parts and a plurality of the second welding parts,
- the plurality of first welding parts are arranged at intervals along a first direction, and
- the plurality of second welding parts are provided between the first welding parts in the first direction.

6. The photoelectric conversion module according to claim 1, wherein
- the first photoelectric conversion element includes a non-photoelectric conversion region that does not contribute to photoelectric conversion, and
- the first welding part and the second welding part overlap the non-photoelectric conversion region when viewed from the thickness direction.

7. The photoelectric conversion module according to claim 1, further comprising:
- a first interconnector that is connected to the first photoelectric conversion element at the first welding part and that electrically connects the first photoelectric conversion element to a third photoelectric conversion element; and
- a second interconnector that is connected to the first photoelectric conversion element at the second welding part and that electrically connects the first photoelectric conversion element to the second photoelectric conversion element.

8. The photoelectric conversion module according to claim 7, wherein the second welding part is provided in a region that does not overlap the first interconnector when viewed from the thickness direction.

9. A paddle comprising: the photoelectric conversion module according to claim 1.

10. A method for manufacturing a photoelectric conversion module, the method comprising:

a step of preparing a first photoelectric conversion element and a second photoelectric conversion element; and a welding step of forming a first welding part on a first surface of the first photoelectric conversion element and forming a second welding part on a second surface of the first photoelectric conversion element, the second surface being opposite to the first surface, wherein in the welding step, the first welding part is formed such that a center of gravity of the first welding part is shifted from a center of gravity of the second welding part when viewed from a thickness direction perpendicular to the first surface of the first photoelectric conversion element, and the second photoelectric conversion element is disposed so as to partially overlap the first photoelectric conversion element over the first surface of the first photoelectric conversion element and so as to cover the first welding part and the second welding part when viewed from the thickness direction.

11. The method for manufacturing a photoelectric conversion module according to claim 10, wherein in the welding step, the first welding part and the second welding part are simultaneously formed.

12. The photoelectric conversion module according to claim 7, wherein the first interconnector and the second interconnector partially overlap each other when viewed from the thickness direction, and the first welding part and the second welding part overlap a region where the first interconnector and the second interconnector overlap each other when viewed from the thickness direction.

13. The photoelectric conversion module according to claim 1, wherein the first photoelectric conversion element and the second photoelectric conversion element are arranged to be shifted each other in a second direction, the first photoelectric conversion element includes a current-collecting electrode, the current-collecting electrode has a second portion extending along a first direction intersecting the second direction, and the first welding part and the second welding part overlap the second portion of the current-collecting electrode when viewed from the thickness direction.

* * * * *